US 7,795,967 B2

(12) United States Patent
Nakai et al.

(10) Patent No.: US 7,795,967 B2
(45) Date of Patent: Sep. 14, 2010

(54) AGC CIRCUIT

(75) Inventors: Takayuki Nakai, Osaka (JP); Takuma Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 76 days.

(21) Appl. No.: 12/298,279

(22) PCT Filed: Mar. 19, 2008

(86) PCT No.: PCT/JP2008/000642

§ 371 (c)(1),
(2), (4) Date: Oct. 23, 2008

(87) PCT Pub. No.: WO2008/114511

PCT Pub. Date: Sep. 25, 2008

(65) Prior Publication Data

US 2009/0096528 A1    Apr. 16, 2009

(30) Foreign Application Priority Data

Mar. 19, 2007    (JP) .............................. 2007-070274

(51) Int. Cl.
*H03G 3/20*    (2006.01)
(52) U.S. Cl. ....................................... 330/129; 330/140
(58) Field of Classification Search ..................... 330/9, 330/86, 129, 140
See application file for complete search history.

(56) References Cited

U.S. PATENT DOCUMENTS

| 5,381,148 | A | 1/1995 | Mueck |
| 6,952,132 | B2* | 10/2005 | Bhattacharjee et al. ...... 330/140 |
| 2005/0077959 | A1* | 4/2005 | Hika ........................... 330/129 |
| 2006/0044065 | A1 | 3/2006 | Ishida |
| 2008/0074185 | A1 | 3/2008 | Ishida |

FOREIGN PATENT DOCUMENTS

| JP | 60-200604 | 10/1985 |
| JP | 61-131073 | 6/1986 |
| JP | 03-074913 | 3/1991 |

(Continued)

OTHER PUBLICATIONS

International Search Report dated May 20, 2008.

*Primary Examiner*—Steven J Mottola
(74) *Attorney, Agent, or Firm*—Dickinson Wright PLLC

(57) ABSTRACT

There is provided an AGC circuit that has a very small offset voltage and is easy for integration, without using any of external capacities. For that reason, a variable gain amplifying circuit (GCA1) which has a gain controlled by a gain control signal, and whose output DC offset is controlled by an offset compensation signal, an A/D conversion circuit (AD1) for A/D converting an output signal of this variable gain amplifying circuit (GCA1), a level detection circuit (Det1) for performing peak detection of an output signal of this A/D conversion circuit (AD1) to thereby detect an amplitude level, a gain control circuit (Gctrl1) for outputting a gain control signal according to an output signal of this level detection circuit (Det1), an offset detection circuit (Det2) provided with a lowpass filter for taking out a DC component from the output signal of the A/D conversion circuit (AD1), and a D/A conversion circuit (DA1) for D/A converting an output signal of the offset detection circuit (Det2) to thereby output the offset compensation signal are provided.

24 Claims, 18 Drawing Sheets

FOREIGN PATENT DOCUMENTS

| | | |
|---|---|---|
| JP | 7-94953 | 4/1995 |
| JP | 08-116226 | 5/1996 |
| JP | 9-500250 | 1/1997 |
| JP | 2000-311350 | 11/2000 |
| JP | 2001-36359 | 2/2001 |
| JP | 2003-22584 | 1/2003 |
| JP | 2003-273673 | 9/2003 |
| JP | 2006-67012 | 3/2006 |
| JP | 2006-165912 | 6/2006 |
| WO | 95/02923 | 1/1995 |

* cited by examiner

AGC CIRCUIT

TECHNICAL FIELD

The present invention relates to an AGC (Automatic Gain Control) circuit for controlling gain of a variable gain amplifying circuit according to amplitude of an input signal, in communication systems or audio systems.

BACKGROUND ART

As a conventional AGC circuit, there is known a configuration in which an integrating circuit using a capacitor is utilized. This AGC circuit is provided with a variable gain amplifying circuit for amplifying or attenuating an input signal according to gain controlled by a gain control voltage to thereby output an output signal, a rectifier circuit for rectifying an output voltage of this variable gain amplifying circuit, an integrating circuit for integrating the voltage rectified by this rectifier circuit to convert it into a DC voltage, and a DC amplifying circuit for outputting a voltage proportional to a difference between the DC voltage inputted from this integrating circuit and a reference voltage, as a gain control voltage of the variable gain amplifying circuit. The integrating circuit is constituted by a resistor and a capacitor (refer to Patent Document 1).

Meanwhile, if a DC offset voltage is included in the input signal of the AGC circuit, the DC offset voltage affects an AGC operation adversely, and thus the AGC operation is not performed normally. Additionally, particularly in the audio systems, this DC offset voltage has an adverse influence on audibility, such as generating a certain noise or the like (It means a low-frequency sound that comes out of a loudspeaker in particular upon turning on and off the power. It may also be called a pop noise.). For that reason, an offset compensation circuit for compensating the DC offset voltage is required. There is known a configuration in which an integrating circuit using a capacitor in the offset compensation circuit is utilized (refer to Patent Document 2).

Moreover, particularly in the audio systems, a DC bias voltage of an output amplification stage connected to a subsequent stage of the AGC circuit for connecting external instruments, such as a line output stage, a headphone output stage, or the like may differ from a DC bias voltage of an audio signal processing stage including the AGC circuit. For that reason, a so-called bias shift circuit for shifting the DC bias voltage of the signal has been used.

Further, with enhancement in function and reduction in cost of audio equipment in recent years, demand for multi-channelization and reduction in the number of parts of the audio systems is increasing greatly.

Patent Document 1: Japanese Unexamined Patent Publication (Kokai) No. H8-116226

Patent Document 2: Japanese Unexamined Patent Publication (Kokai) No. H3-74913

DISCLOSURE OF THE INVENTION

Problem to be Solved by the Invention

In the aforementioned conventional AGC circuit, however, in order to detect an amplitude level of the output signal, the output signal of the variable gain amplifying circuit must be converted into a DC voltage by integrating the signal rectified by the rectifier circuit.

However, in order to achieve it, it is necessary to fully increase a time constant of an integral operation determined by a resistance value and a capacitance value of the integrating circuit with respect to the minimum signal cycle of an analog signal as the input signal of the variable gain amplifying circuit. As a result of this, there has been a problem that the capacitance value of the capacitor has become so large that the capacitor used as the integrating circuit could not mount in the integrated circuit.

For example, in terms of an attack time and a recovery time that indicate a response time of the AGC circuit, in order to set the former to about 1 millisecond and to set the latter to about 1 second, a capacitor with a capacitance value of 0.47 microfarads is required. As a result, the capacitor must be attached externally. In addition, it takes several seconds for a rise time upon turning on the power due to this large capacitance value.

There is a similar problem also in the integrating circuit in the offset compensation circuit with respect to the capacitance value of the capacitor.

Further, these problems will be still more remarkable when a plurality of the aforementioned conventional AGC circuits are required to achieve multi-channelization thereof.

Therefore, it is an object of the present invention to provide an AGC circuit that is easily incorporated in an integrated circuit, without the needs of the integrating circuit using the capacitor in the offset compensation circuit and the gain control circuit.

Means for Solving the Problem

In order to solve the aforementioned problems, an AGC circuit according to the present invention is provided with a variable gain amplifying circuit for amplifying an inputted signal; an A/D conversion circuit for A/D converting an output signal of the variable gain amplifying circuit; a gain control unit for detecting an output amplitude of the variable gain amplifying circuit from an output signal of the A/D conversion circuit, comparing the output amplitude of the variable gain amplifying circuit with a preset reference amplitude to thereby generate gain control signals, and outputting the generated gain control signals to the variable gain amplifying circuit; and an offset compensation unit for detecting an output DC offset amount of the variable gain amplifying circuit from the output signal of the A/D conversion circuit, generating an offset compensation signal for compensating an output DC offset of the variable gain amplifying circuit, and outputting the generated gain control signals to the variable gain amplifying circuit.

According to this configuration, since the gain control signals and the offset compensation signal are created as digital signals based on the output signal of the A/D conversion circuit, capacitors of integrating circuits respectively constituting a rectifier circuit for generating the gain control signals and a rectifier circuit for generating the offset detection signal which have been required in the conventional AGC circuit can be eliminated, allowing the AGC circuit to be incorporated in an integrated circuit easily. Additionally, since the A/D conversion circuit can be shared with the gain control and the offset compensation, complication of the configuration can be suppressed In the AGC circuit of the aforementioned configuration, the variable gain amplifying circuit is comprised of a signal input terminal, a signal output terminal, gain control terminals into which the gain control signals are inputted, an offset compensation terminal into which the offset compensation signal is inputted, a reference voltage terminal into which a reference voltage is inputted, a differential amplifying circuit whose output terminal becomes the signal output terminal, a first variable resistor connected between the offset compensation terminal and an inversed input terminal of the differential amplifying circuit, a second variable resistor connected between the inversed input terminal of the differential amplifying circuit and the output terminal thereof, a third variable resistor connected between the signal input terminal and a non-inverting input terminal of the differential amplifying circuit, and a fourth variable resistor connected between the non-inverting input terminal of the differential amplifying circuit and the reference voltage terminal, and it is preferable that the first to fourth variable resistors change resistance values according to the gain control signals inputted from the gain control terminals.

Moreover, in the AGC circuit of the aforementioned configuration, the reference amplitude is preferably set by a register.

Additionally, in the AGC circuit of the aforementioned configuration, it is preferable that the gain control unit is comprised of a level detection circuit for detecting the output amplitude of the variable gain amplifying circuit from the output signal of the A/D conversion circuit, and a gain control circuit for comparing the output amplitude of the variable gain amplifying circuit detected by the level detection circuit with the preset reference amplitude to thereby generate the gain control signals, and outputting the generated gain control signals to the variable gain amplifying circuit.

Additionally, in the AGC circuit of the aforementioned configuration, it is preferable that the offset compensation unit is comprised of an offset detection circuit for detecting the output DC offset amount of the variable gain amplifying circuit from the output signal of the A/D conversion circuit, and an offset compensation circuit comprised of, for example, a D/A conversion circuit for generating the offset compensation signal which compensates the output DC offset of the variable gain amplifying circuit detected by the offset detection circuit, and outputting the generated offset compensation signal to the variable gain amplifying circuit.

The above-described offset detection circuit is comprised of a lowpass filter for extracting low-pass components in the output signal of the A/D conversion circuit, for example. A DC component in the output signal of the A/D conversion circuit is detected by this lowpass filter.

As the above-described offset detection circuit, a configuration comprised of a highpass filter for extracting high-pass components in the output signal of the A/D conversion circuit, and a subtractor for subtracting an output signal of the highpass filter from the output signal of the A/D conversion circuit may be used.

While this highpass filter is constituted by a digital circuit similar to the above-described lowpass filter, the circuit scale thereof is small as compared with that of the lowpass filter. For that reason, the subtractor is required for detection of the DC component including an offset component, but the circuit scale when the highpass filter and the subtractor are used becomes smaller as compared with a case of using the lowpass filter in considering the whole offset detection circuit, and it is advantageous for integration.

Moreover, as the above-described offset detection circuit, a configuration comprised of a lowpass filter for extracting low-pass components in the output signal of the A/D conversion circuit, a comparator for comparing an output signal of the lowpass filter with predetermined reference data, and an up/down counter for up-counting or down-counting input clocks using a comparison result signal of the comparator as an up/down switching signal may be employed.

According to this configuration, an offset amount can be detected as the count value. As a result, the following action effects will be obtained. Although it is required to insert a digital amplifier having a gain according to a required offset compensation amount if the up/down counter is not used, using the up/down counter makes it possible to detect the offset amount at a proper gain without using the digital amplifier, so that it is advantageous for integration.

Further, as the above-described offset detection circuit, a configuration comprised of a highpass filter for extracting high-pass components in the output signal of the A/D conversion circuit, a subtractor for subtracting an output signal of the highpass filter from the output signal of the A/D conversion circuit, a comparator for comparing an output signal of the subtractor with predetermined reference data, and an up/down counter for up-counting or down-counting input clocks using a comparison result signal of the comparator as an up/down switching signal may be employed.

It is to be noted that above-described offset detection circuit may be comprised of an upper peak value detector for detecting an upper peak value of the output signal of the A/D conversion circuit, a lower peak value detection circuit for detecting a lower peak value of the output signal of the A/D conversion circuit, and a median value calculating unit for calculating a median value between the upper peak value and the lower peak value.

Meanwhile, in the AGC circuit of the aforementioned configuration, it is preferable that the variable gain amplifying circuit includes a resistance circuit for determining a gain, and the resistance circuit is comprised of a plurality of resistors that have different resistance values, respectively, and are selected according to the gain control signals.

Further, in the AGC circuit of the aforementioned configuration, it may be a configuration that the variable gain amplifying circuit includes a resistance circuit for determining a gain, and the resistance circuit is comprised of a MOSFET whose drain resistance changes according to the gain control signal inputted into a gate thereof.

Still further, in the AGC circuit of the aforementioned configuration, it may be a configuration that the variable gain amplifying circuit includes a resistance circuit for determining a gain, and the resistance circuit is comprised of a diode whose forward resistance changes according to the gain control signal that flows in the form of a current.

Yet still further, in the AGC circuit of the aforementioned configuration, it may be a configuration that the variable gain amplifying circuit includes a resistance circuit for determining a gain, and the resistance circuit is comprised of a combination of at least any two of a plurality of resistors that have different resistance values, respectively, and are selected according to the gain control signals, a MOSFET whose drain resistance changes according to the gain control signal inputted into a gate thereof, and a diode whose forward resistance changes according to the gain control signal that flows in the form of a current.

Yet still further, in the AGC circuit of the aforementioned configuration, it is preferable that the variable gain amplifying circuit is provided with a bias shift function that differentiates an input DC bias voltage and an output DC bias voltage.

Yet still further, in the AGC circuit of the aforementioned configuration, it is preferable that either or both of the gain control unit and the offset compensation unit have output value holding means for holding an output value.

Yet still further, in the AGC circuit of the aforementioned configuration, it is preferable that either or both of the gain control unit and the offset compensation unit are provided with output value holding means for holding an output value, and the AGC circuit is provided with a mode control circuit for operating either or both of the gain control unit and the offset compensation unit in a low consumption current mode of stopping operations of circuit units which are not used by the output holding means, during a state of holding the output value by the output holding means.

Yet still further, in the AGC circuit of the aforementioned configuration, it may be configured that both the gain control unit and the offset compensation unit are provided with output value holding means for holding an output value, and the AGC circuit is provided with a mode control circuit for making the gain control unit and the offset compensation unit perform an exclusive operation such that the offset compensation unit performs an offset compensation operation during a period when the gain control unit holds the output value by the output holding means, and the gain control unit performs a gain control operation during a period when the offset compensation unit holds the output value by the output holding means.

Additionally, in the aforementioned configuration, it is preferable that a voltage value corresponding to one LSB of the A/D conversion circuit during a period when the gain control unit is performing the gain control operation is increased to thereby increase an input dynamic range, a voltage value corresponding to one LSB of the A/D conversion circuit is reduced during a period when the offset compensation unit is performing the offset compensation operation as compare with a period when the gain control unit is performing the gain control operation to thereby reduce the input dynamic range. Namely, it is preferable that by differentiating a voltage value corresponding to one LSB of the A/D conversion circuit during a period when the gain control unit is performing the gain control operation, and a voltage value corresponding to one LSB of the A/D conversion circuit during a period when the offset compensation unit is performing the offset compensation operation, the input dynamic range of the A/D conversion circuit during a period when the gain control unit is performing the gain control operation, and the input dynamic range of the A/D conversion circuit during a period when the offset compensation unit is performing the offset compensation operation are differentiated.

Yet still further, in the AGC circuit of the aforementioned configuration, the gain of the input stage amplifier of the A/D conversion circuit during a period when the gain control unit is performing the gain control operation may be reduced to thereby increase the input dynamic range, and the gain of the input stage amplifier of the A/D conversion circuit may be increased during a period when the offset compensation unit is performing the offset compensation operation as compare with a period when the gain control unit is performing the gain control operation to thereby reduce the input dynamic range. Namely, by differentiating the gain of the input stage amplifier of the A/D conversion circuit during a period when the gain control unit is performing the gain control operation, and the gain of the input stage amplifier of the A/D conversion circuit during a period when the offset compensation unit is performing the offset compensation operation, the input dynamic range of the A/D conversion circuit during a period when the gain control unit is performing the gain control operation, and the input dynamic range of the A/D conversion circuit during a period when the offset compensation unit is performing the offset compensation operation may be differentiated.

Additionally, in the aforementioned configuration, in terms of the reference voltage that the A/D conversion circuit refers to for determining the input dynamic range of the A/D conversion circuit, by differentiating values between the reference voltage of the A/D conversion circuit during a period when the gain control unit is performing the gain control operation, and the reference voltage of the A/D conversion circuit during a period when the offset compensation unit is performing the offset compensation operation, the input dynamic range of the A/D conversion circuit during a period when the gain control unit is performing the gain control operation may be increased, and the input dynamic range of the A/D conversion circuit during a period when the offset compensation unit is performing the offset compensation operation may be reduced. Namely, as described above, by differentiating the reference voltages of the A/D conversion circuit in two cases the input dynamic range of the A/D conversion circuit during a period when the gain control unit is performing the gain control operation, and the input dynamic range of the A/D conversion circuit during a period when the offset compensation unit is performing the offset compensation operation may be differentiated.

Yet still further, in the AGC circuit of the aforementioned configuration, it is preferable that the AGC circuit is provided with a plurality of variable gain amplifying circuit, wherein the gain control unit gain-controls the plurality of variable gain amplifying circuits, and the offset compensation unit offset-compensates the plurality of variable gain amplifying circuits.

Additionally, in the aforementioned configuration, it is preferable that the gain control unit gain-controls the plurality of variable gain amplifying circuits in time sharing, and the offset compensation unit offset-compensates the plurality of variable gain amplifying circuits in time sharing.

Hereinafter, it will be further described. In the present invention, it is configured so as to be provided with a variable gain amplifying circuit which has a gain controlled by a gain control signal, and whose output DC offset is controlled by an offset compensation signal, an A/D conversion circuit for A/D converting an output signal of the variable gain amplifying circuit, a level detection circuit for performing peak detection of an output signal of this A/D conversion circuit to thereby detect an amplitude level, a gain control circuit for outputting a gain control signal according to an output signal of this level detection circuit, an offset detection circuit provided with, for example, a lowpass filter for taking out the DC component from the output signal of the A/D conversion circuit, and a D/A conversion circuit for D/A converting an output signal of the offset detection circuit to thereby output the offset compensation signal, and the gain control signals and the offset compensation signal obtained here are to supplied to the variable gain amplifying circuit.

Here, when the resistance circuit for determining the gain of the variable gain amplifying circuit takes a mode comprised of a plurality of fixed resistors and a plurality of switches for selecting these resistors according to the gain control signals, the gain control signal can be achieved by setting it as the logic signal for ON/OFF controlling the switches connected to the plurality of fixed resistors.

Meanwhile, when the resistance circuit for determining the gain of the variable gain amplifying circuit includes a drain-source resistance of the MOSFET, and takes a mode of controlling this drain-source resistance by the gate voltage of the MOSFET, the gain control signal can be achieved by D/A converting the output signal of the gain control circuit into an analog voltage signal.

Additionally, when the resistance circuit for determining the gain of the variable gain amplifying circuit includes a forward resistance of the diode, and takes a mode of controlling this forward resistance by the forward current of the diode, the gain control signal can also be achieved by D/A converting the output signal of the gain control circuit into an analog current signal.

Further, a combination of at least any two of the fixed resistor, the MOSFET, and the diode may be used.

Moreover, preferably, a holding circuit of the gain control signal and a holding circuit of the offset compensation signal are used to exclusively set a gain control operation period and an offset compensation operation period, and to change the input dynamic range of the A/D conversion circuit between the gain control operation period and the offset compensation operation period, so that the input dynamic range of the A/D conversion circuit is increased during the gain control operation period when a relatively large amplitude is treated as the input signal of the A/D conversion circuit, whereas the input dynamic range of the A/D conversion circuit is decreased during the offset compensation operation period when a small amplitude near the DC bias voltage is treated. Incidentally, the dynamic range can be increased or decreased by changing any of the reference voltage, the resolution, and the gain of the A/D conversion circuit.

Further, the gain control operation and the offset compensation operation of a plurality (at least two or more) of variable gain amplifying circuits are performed in time sharing by one A/D conversion circuit, level detection circuit, gain control circuit, offset detection circuit, and D/A conversion circuit (hereinafter, called control circuit) so that even when two or more AGC circuits are required, it can be achieved by adding the variable gain amplifying circuit, the holding circuit of the gain control signal, and the holding circuit of the offset compensation signal thereto by the required number of AGC circuits, and thus addition of the A/D conversion circuit and the D/A conversion circuit which require a large chip area is not required. Particularly in the audio systems, since the signal frequency is a relatively low frequency with 20 kHz or less, the present AGC circuit is greatly effective.

According to this configuration, the capacitor in the integrating circuit for the rectifier circuit and for the offset detection circuit which has been required in the aforementioned conventional AGC circuit can be eliminated, and multi-channelization of the AGC circuit can be further achieved without an increase in a circuit scale and a chip area.

EFFECT OF THE INVENTION

According to the present invention, it is possible to provide the AGC circuit that can also be incorporated in an integrated circuit easily without the needs of the integrating circuit using the capacitor at all. Particularly in the audio systems, it is easily possible to provide a multi-channel AGC circuit at low cost as a result without an increase in a chip area.

EXPLANATIONS OF LETTERS OR NUMERALS

GCA1 to GCAn: Variable gain amplifying circuit
Amp1: Differential amplifying circuit
AD1: A/D conversion circuit
DA1: D/A conversion circuit
Det1: Level detection circuit
Det2: Offset detection circuit
Gctrl1: Gain control circuit
Reg1: Register Ctrl1 to Ctrl3: Mode control circuit MUX1: Selector circuit GLatch1 to GLatchn: Gain control signal holding circuit OLatch1 to OLatchn: Offset compensation signal holding circuit

BEST MODE(S) FOR CARRYING OUT THE INVENTION

Hereinafter, the best mode(s) for carrying out the present invention will be described with reference to the drawings.

First Embodiment

Figure 1:
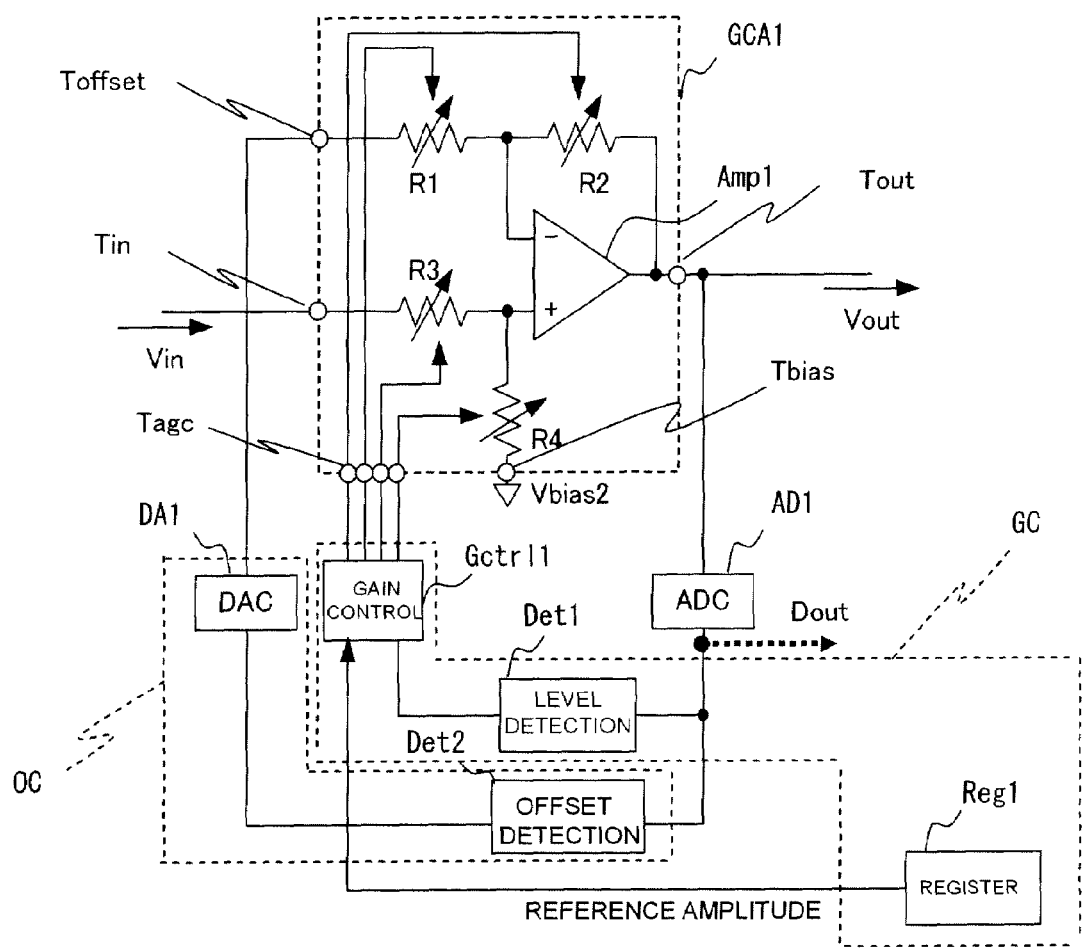
FIG. 1 is a block diagram showing a configuration of an AGC circuit in accordance with a first embodiment of the present invention.

FIG. 1 shows a typical configuration of an AGC circuit in accordance with a first embodiment of the present invention.

In FIG. 1, symbol GCA1 represents a variable gain amplifying circuit constituted by a differential amplifying circuit Amp1, and variable resistors R1, R2, R3, and R4. Symbol Tin represents a signal input terminal into which an analog voltage, for example, an analog audio signal or the like, is inputted. Symbol Tout represents a signal output terminal from which an amplified or attenuated analog voltage is outputted, for example. Symbol Tagc represents gain control terminals into which gain control signals are inputted. Symbol Toffset represents an offset compensation terminal into which an offset compensation signal is inputted. Symbol Tbias represents a reference voltage terminal into which a reference voltage for determining an output bias voltage is inputted.

Symbol AD1 represents an A/D conversion circuit for A/D converting an output signal of the variable gain amplifying circuit GCA1. While an analog voltage is outputted from the above-described signal output terminal Tout, a digital output Dout corresponding to the analog voltage outputted from the aforementioned signal output terminal Tout can be taken out from the A/D conversion circuit AD1.

Symbol Det1 represents a digital level (amplitude) detection circuit that performs detection of an upper peak value and a lower peak value of the output signal of the A/D conversion circuit AD1, and detects an amplitude level from a difference between the upper peak value and the lower peak value.

Symbol Reg1 represents a register that stores reference amplitude Vagc for determining the maximum output amplitude of the AGC circuit, a time interval Tdet for performing a gain control operation of the AGC circuit, and a maximum gain variable width Gstep in one gain control operation of the AGC circuit.

Symbol Gctrl1 represents a gain control circuit. This gain control circuit Gctrl1 compares an output signal of the level detection circuit Det1 with the reference amplitude Vagc stored in the register Reg1 for every time interval Tdet stored in the register Reg1, and when it is determined that the output amplitude of the variable gain amplifying circuit GCA1 exceeds the reference amplitude Vagc, it outputs the gain control signals that change gain of the variable gain amplifying circuit GCA1 to the variable gain amplifying circuit GCA1 within a range that does not exceed the maximum variable width Gstep of the gain stored in the register Reg1. Such operation of the gain control circuit Gctrl1 controls the gain of the variable gain amplifying circuit GCA1 so that the output amplitude of the variable gain amplifying circuit GCA1 may correspond to the reference amplitude Vagc. It is to be noted that as for the gain control circuit Gctrl1, a configuration of an output portion thereof is appropriately designed corresponding to a configuration of the variable resistors R1 to R4, which are controlled objects.

A gain control unit GC that suppresses the output amplitude of the variable gain amplifying circuit GCA1 to a certain level or less is constituted by the above-described gain control circuit Gctrl1, level detection circuit Det1, and register Reg1. Thereby, the output amplitude of the variable gain amplifying circuit GCA1 is controlled so as to correspond to the reference amplitude.

Figure 14:
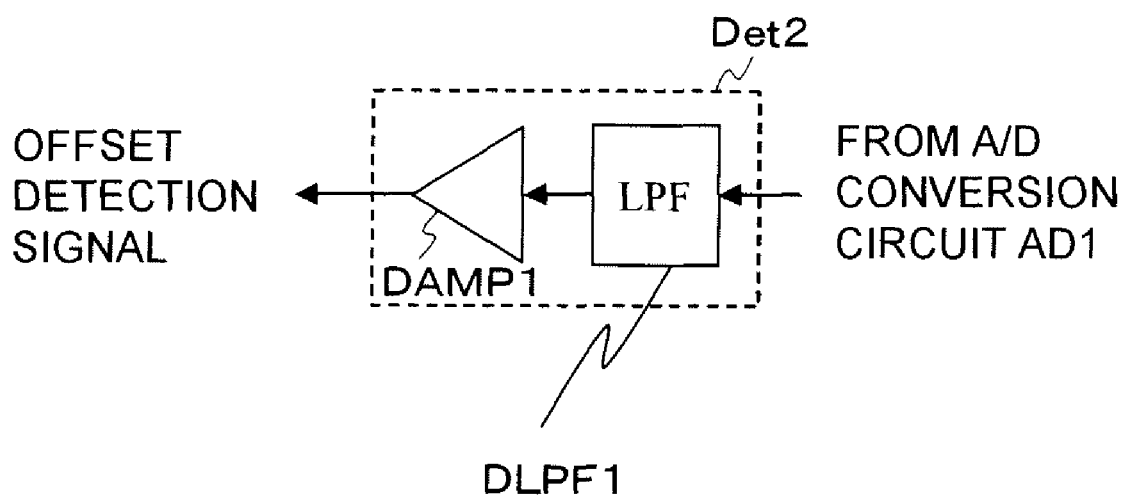
FIG. 14 is a block diagram showing a first configuration example of an offset detection circuit in the AGC circuit in accordance with the first embodiment of the present invention.

Symbol Det2 represents an offset detection circuit comprised of, for example, a digital lowpass filter for detecting a DC offset voltage of the output signal of the A/D conversion circuit AD1. This offset detection circuit Det1 is specifically constituted by a digital lowpass filter DLPF1 for extracting low-pass components (including an offset component) using the output signal of the A/D conversion circuit AD1 as an input, and a digital amplifier DAMP1 for amplifying an output of this digital lowpass filter DLPF1 as shown in, for example, FIG. 14. An output of this digital amplifier DAMP1 results in an offset detection signal. Incidentally, the digital amplifier DAMP1 is provided for gain adjusting. The digital amplifier DAMP1 may be omitted unless the gain adjustment is necessary in the offset detection circuit Det2.

Symbol DA1 represents a D/A conversion circuit serving as an offset compensation circuit for outputting the offset compensation signal according to an output signal of the offset detection circuit Det2 as an analog signal. This D/A conversion circuit DA1 may incorporate a digital amplifier for gain adjustment, and in that case, the digital amplifier DAMP1 in the offset detection circuit Det2 may be omitted.

An offset compensation unit OC is constituted by the above-described offset detection circuit Det2 and D/A conversion circuit DA1.

Concrete operations will be described hereinafter. First, an input signal Vin is defined as follows.

$$Vin = Vac + Vbias1 + \Delta V \quad \text{[Equation 1]}$$

Where, symbol Vac represents an AC component of the input signal, symbol Vbias1 represents a DC bias voltage of the input signal, and symbol $\Delta V$ represents a DC offset included in the input signal Vin. The DC offset $\Delta V$ in each component of the aforementioned input signal Vin is an error voltage generated in a circuit preceding to the AGC circuit, and it causes operational malfunctions of the AGC circuit, low frequency sounds in the audio systems, or the like, thereby requiring the compensation.

Moreover, the aforementioned input signal Vin is inputted into a non-inverting input terminal of the differential amplifying circuit Amp1 through the variable resistor R3, and along with it, a reference voltage Vbias2 for determining the output bias voltage is inputted thereinto through the variable resistor R4.

Further, the offset compensation signal (Vbias1+$\Delta V$) outputted from the D/A conversion circuit DA1 is inputted into an inverting input terminal of the differential amplifying circuit Amp1 through the variable resistor R1, and along with, an output signal Vout is fed back through the variable resistor R2.

When the aforementioned input signal Vin is inputted into the variable gain amplifying circuit GCA1, if the next relation [Equation 2] is satisfied among the values of the variable resistors R1, R2, R3, and R4 shown in FIG. 1, $$R4=(R3+R4)R2/(R1+R2) \quad \text{[Equation 2]}$$

$$Vout = \frac{R2}{R1} * \frac{(R1+R2)(R3+R4)}{R1R3+2R2R3+R2R4} Vac + \frac{R3}{R1} * \frac{(R1+R2)^2}{R1R3+2R2R3+R2R4} Vbias2 \quad \text{[Equation 3]}$$

[Equation 3] is obtained, so that the offset voltage ΔV is compensated at the output of the variable gain amplifying circuit GCA1. In addition, a DC bias voltage at the AGC circuit output can be set to a value different from a DC bias voltage at the AGC circuit input. Namely, it will be provided with a so-called bias shift function that shifts the DC bias voltage in the signal.

Further, if the next relations, R1=R3 and R2=R4, are satisfied among the values of the variable resistors R1, R2, R3, and R4, the equation of the output signal Vout is simplified as follows.

$$Vout=(R2/R2)Vac+Vbias2 \quad \text{[Equation 4]}$$

Thus [Equation 4] is obtained. The offset voltage ΔV is also compensated in this case, and the DC bias voltage at the AGC circuit output can be set to a value different from the DC bias voltage at the AGC circuit input (bias shift operation).

Here, the reason why the offset voltage ΔV is compensated will be further described. Here, it will be described only paying attention to a DC component. If and R2=R4 are satisfied in the configuration shown in FIG. 1, the input signal (voltage) Vin of the signal input terminal Tin becomes equal to the voltage Voffset (=Vbias1+ΔV) of the offset compensation terminal Toffset. For that reason, when the reference voltage Vbias2 is given to the reference voltage terminal Tbias, the output signal (voltage) Vout at the signal output terminal Tout becomes equal to the reference voltage Vbias2 (Vout=Vbias2). The reference voltage Vbias2 is a voltage arbitrarily set, and when it is set to Vbias2=Vbias1, the output signal Vout becomes Vout=Vbias1, thus resulting in a state where the DC offset ΔV is canceled. The bias voltage will be shifted if the reference voltage Vbias2 is set to a value different from the DC bias voltage Vbias1 of the input signal.

Hereinafter, the case where the variable resistors R1 to R4 have a relation of R1=R3 and R2=R4 will be described for simplification. First, a gain G of the variable gain amplifying circuit GCA1 shown in FIG. 1 is set as [Equation 5] based on the aforementioned description.

$$G=R2/R1 \quad \text{[Equation 5]}$$

The output signal Vout of the variable gain amplifying circuit GCA1 is converted into a digital signal by the A/D conversion circuit AD1, and the maximum peak value and the minimum peak value of the signal Vout within a period of the amplitude detection time Tdet set in the register Reg1 are detected in the level detection circuit Det1, thereby an amplitude level (G|Vac|) is obtained. The gain control circuit Gctrl1 compares an amplitude level detected signal of the level detection circuit Det1 with the reference amplitude Vagc stored in the register Reg1, and outputs the gain control signals for controlling the values of the variable resistors R1, R2, R3, and R4, respectively, based on this comparison result. The resistance values of the variable resistors R1, R2, R3, and R4 are changed by the gain control signals, and thereby the gain G of the variable gain amplifying circuit GCA1 is controlled.

Since a steep change in a gain causes a steep change in an envelope curve in the gain control operation and it is not preferable in audibility, the gain of the variable gain amplifying circuit GCA1 is controlled not to exceed the maximum variable step Gstep of the gain set in the register.

A maximum inclination of the gain change on a time-axis is set by the aforementioned amplitude detection time Tdet and maximum variable step Gstep of the gain control signals, and a steep change in a signal envelope curve is suppressed, thus allowing natural AGC operations to be performed in audibility. The level detection circuit Det1 and the offset detection circuit Det2 make it possible to achieve a function for improving response characteristics of the gain control unit GC including the level detection circuit Det1.

Figure 2:
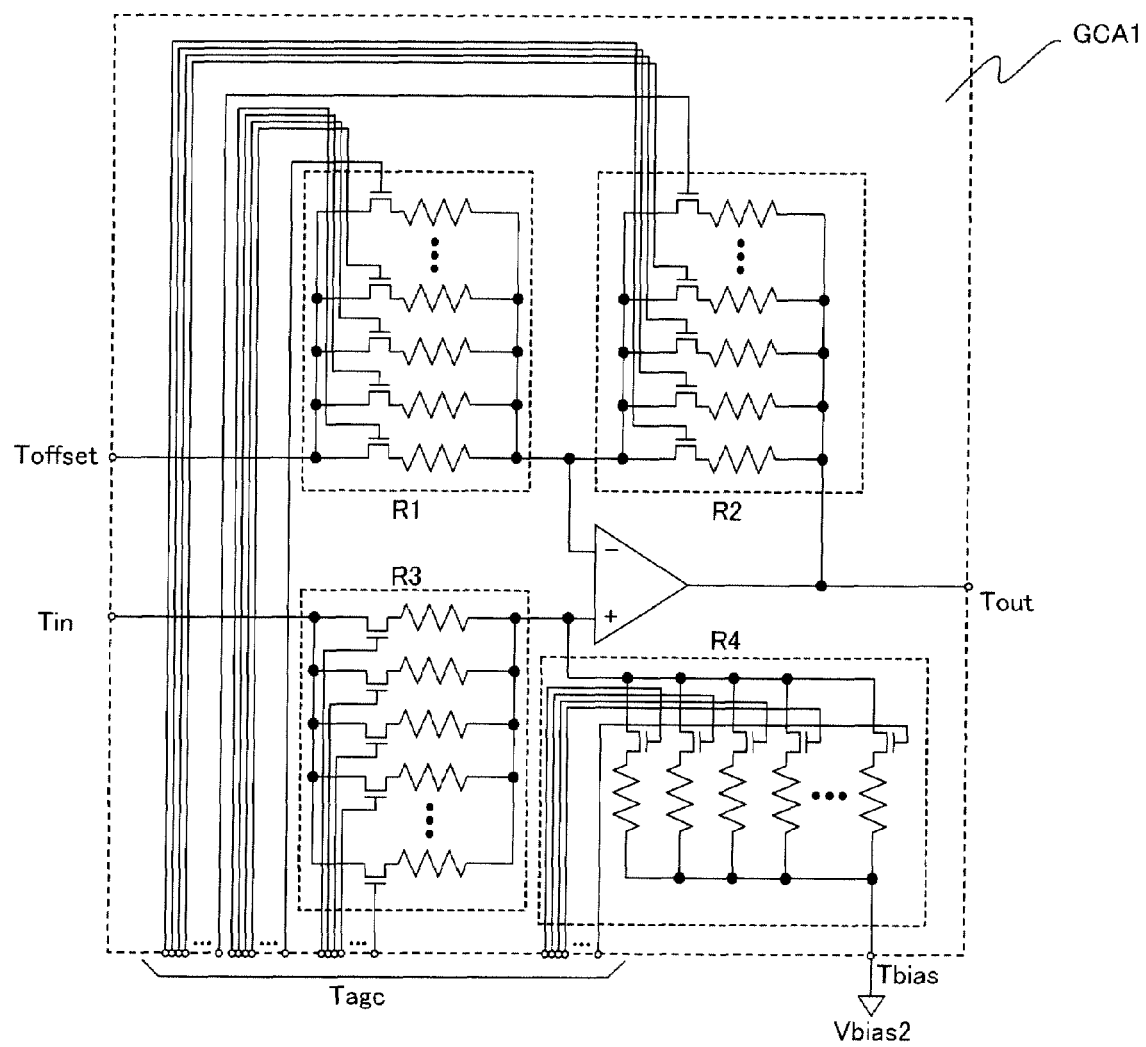
FIG. 2 is a block diagram showing a configuration of a variable gain amplifying circuit included in the AGC circuit in accordance with the first embodiment of the present invention.

Meanwhile, the variable resistors R1, R2, R3, and R4 of the variable gain amplifying circuit GCA1 may be constituted as shown in FIG. 2. Namely, a plurality of circuits, each having a fixed resistor and a MOSFET serving as a switch connected in series, are connected in parallel. A logic signal is then inputted into the MOSFET connected to the fixed resistor which constitutes each of the variable resistors, as the gain control signal, and a combined resistance of the variable resistors value is determined by turning ON or OFF respective MOSFETs, so that the resistance values R1, R2, R3, and R4 are determined. As a result, the gain of the variable gain amplifying circuit CCA1 is determined.

Figure 3:
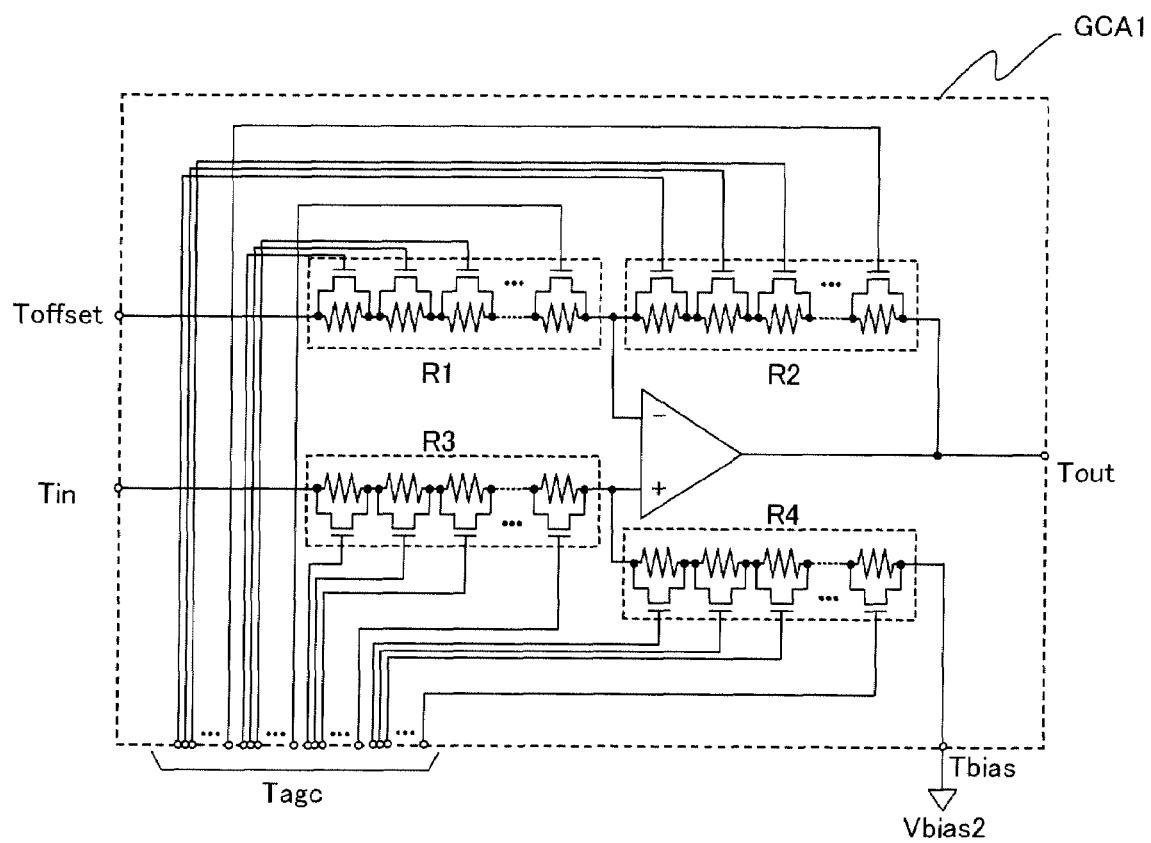
FIG. 3 is a block diagram showing another configuration of the variable gain amplifying circuit included in the AGC circuit in accordance with the first embodiment of the present invention.

In addition, the variable resistors R1, R2, R3, and R4 of the variable gain amplifying circuit GCA1 may be configured in such a way that a plurality of circuits, each having a fixed resistor and a MOSFET connected in parallel, are connected in series to thereby obtain a combined resistance as shown in FIG. 3.

Figure 4:
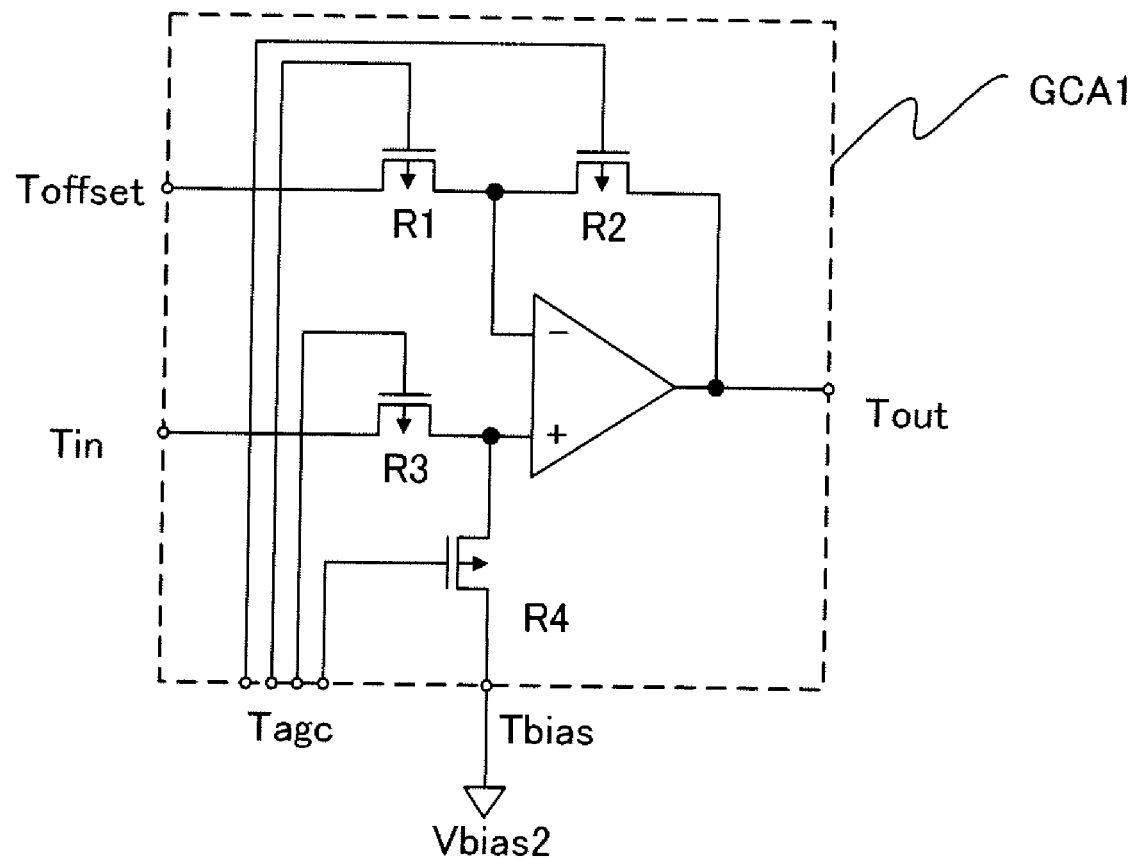
FIG. 4 is a block diagram showing still another configuration of the variable gain amplifying circuit included in the AGC circuit in accordance with the first embodiment of the present invention.

Additionally, the variable gain amplifying circuit GCA1 may be constituted as shown in FIG. 4. Namely, the variable resistors R1, R2, R3, and R4 may be constituted by drain resistances of MOSFETs. A gate voltage is then inputted into the MOSFET which constitutes each of the variable resistors R1, R2, R3, and R4 as the gain control signal, and a drain resistance value is determined by changing this gate voltage. As a result, the gain of the variable gain amplifying circuit GCA1 is determined.

Figure 5:
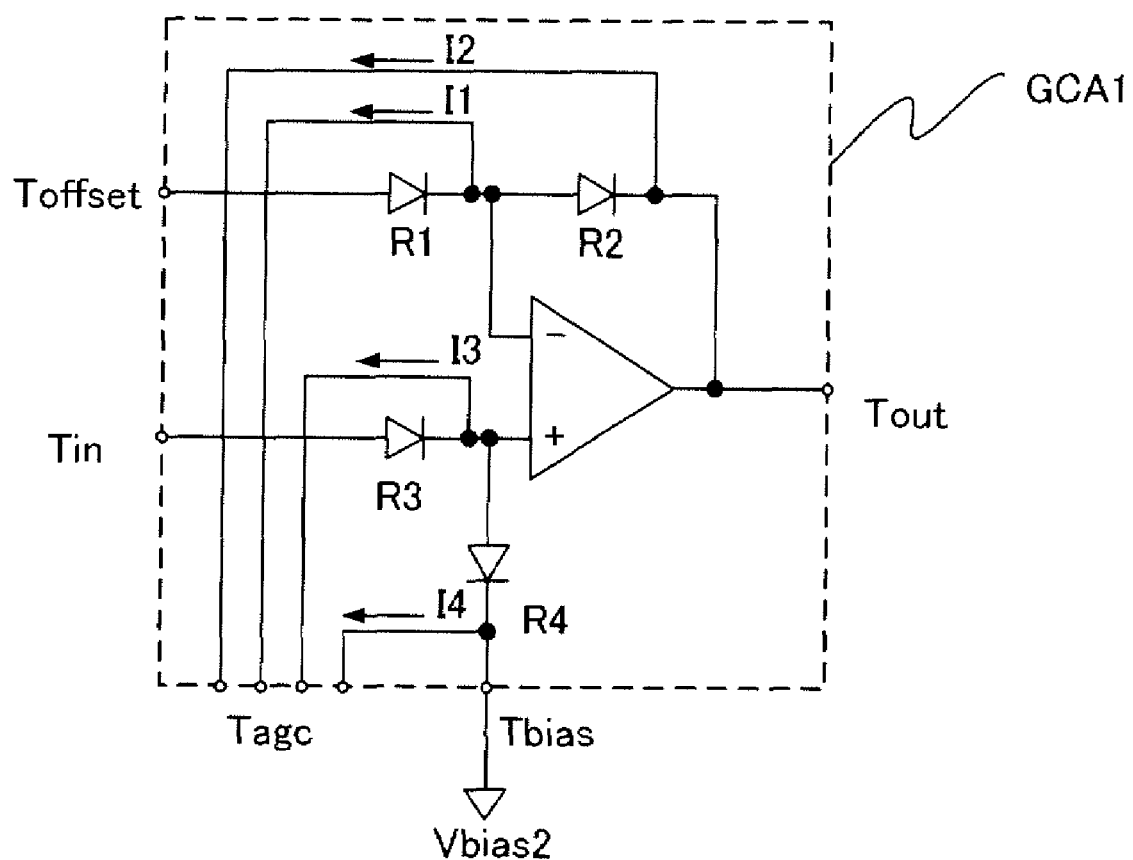
FIG. 5 is a block diagram showing yet still another configuration of the variable gain amplifying circuit included in the AGC circuit in accordance with the first embodiment of the present invention.

Moreover, the variable gain amplifying circuit GCA1 may be constituted as shown in FIG. 5. Namely, the variable resistors R1, R2, R3, and R4 may be constituted by forward resistances of diodes. A forward current is then inputted into each of the diode R1, R2, R3, and R4 which constitute variable resistances as the gain control signal, and a forward resistance value is determined by changing this forward current. As a result, the gain of the variable gain amplifying circuit GCA1 is determined.

Figure 6:
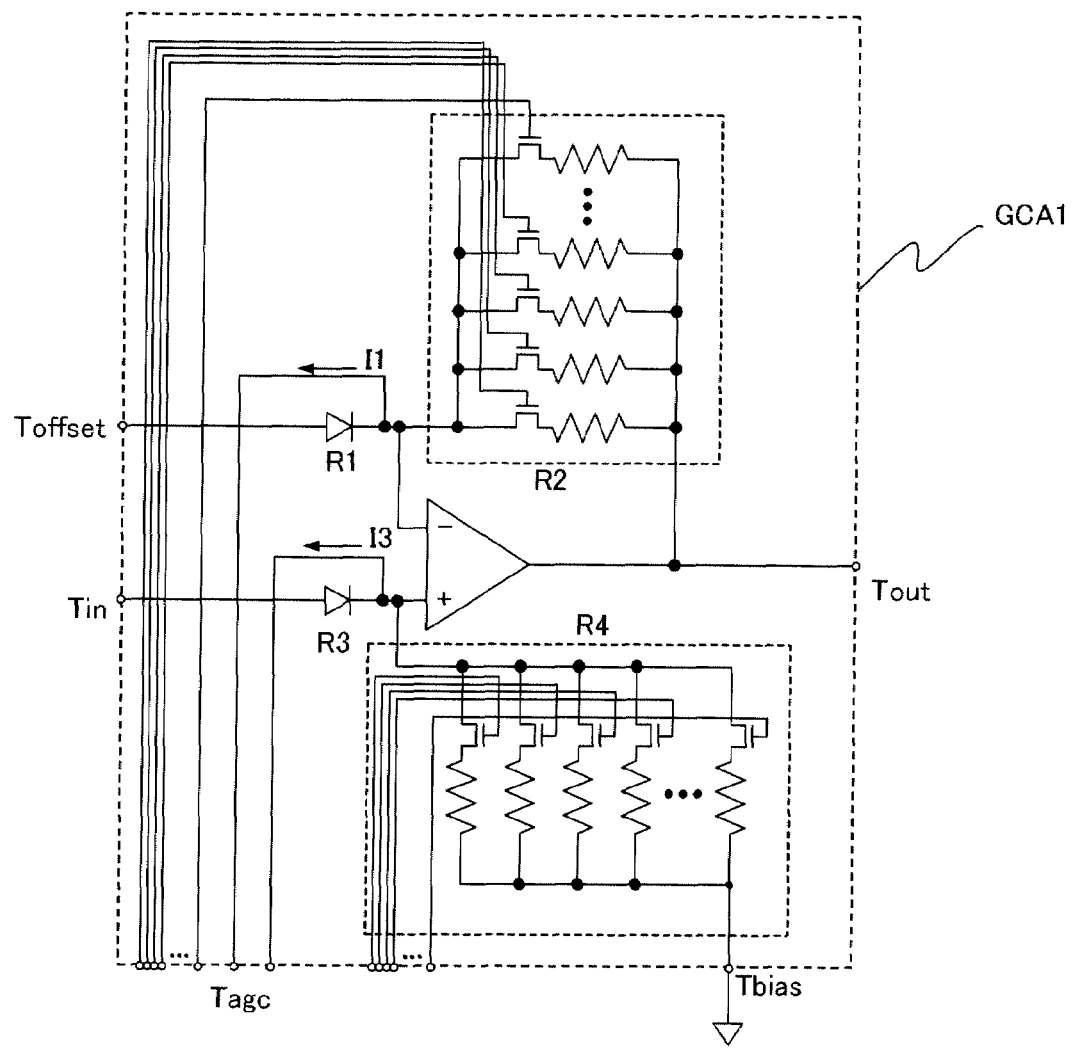
FIG. 6 is a block diagram showing yet still another configuration of the variable gain amplifying circuit included in the AGC circuit in accordance with the first embodiment of the present invention.
Figure 7:
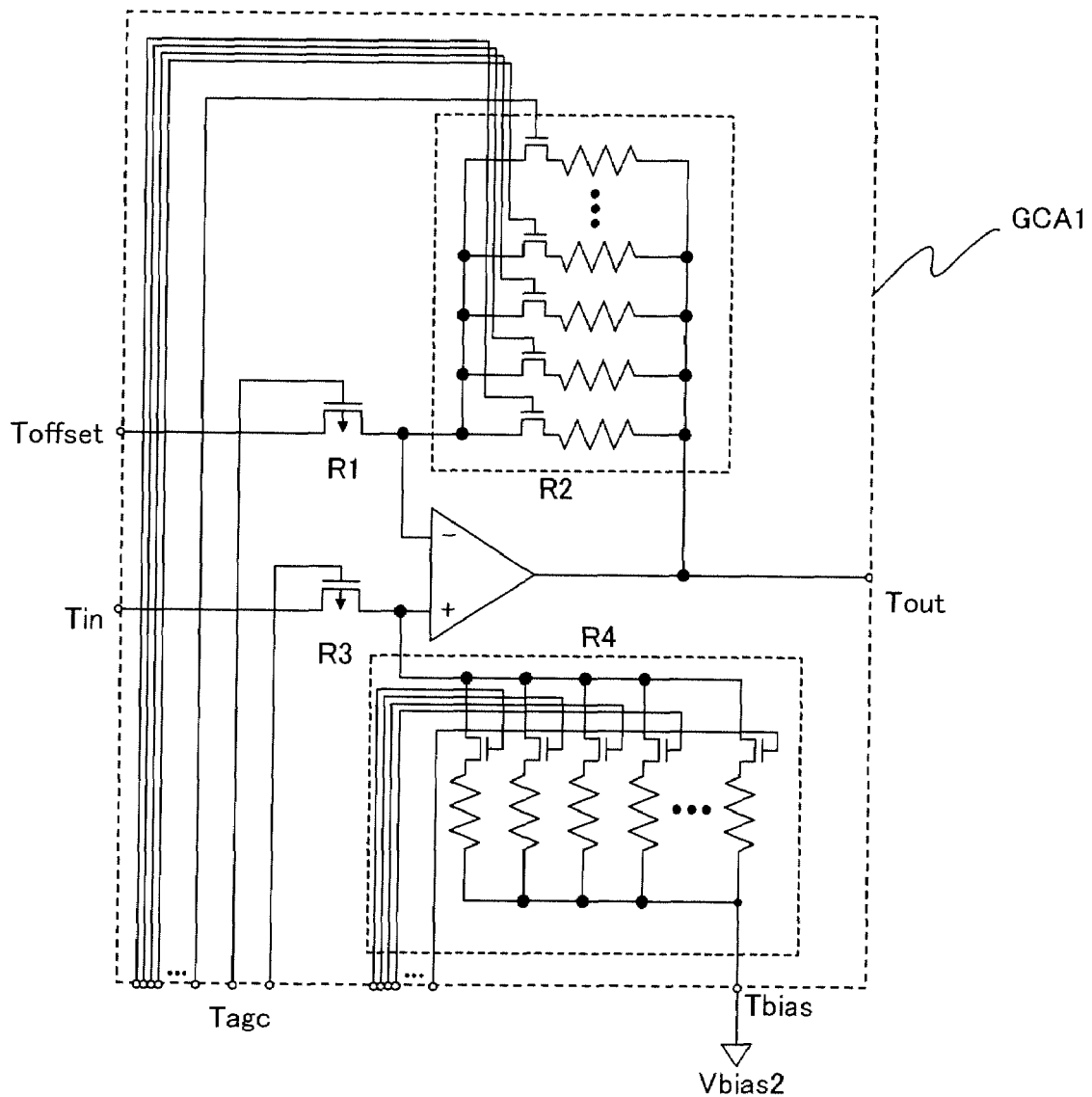
FIG. 7 is a block diagram showing yet still another configuration of the variable gain amplifying circuit included in the AGC circuit in accordance with the first embodiment of the present invention.

It is to be noted that a configuration in which forward resistances of diodes are used as the variable resistors R1 and R3, and a plurality of circuits, each having a fixed resistor and a MOSFET that are connected in series, are connected in parallel as the variable resistors R2 and R4 as shown in FIG. 6 may be used. Moreover, there may be employed a configuration in which drain resistances of MOSFETs are used as the variable resistors R1 and R3, and a plurality of circuits, each having a fixed resistor and a MOS transistor that are connected in series, are connected in parallel as the variable resistors R2 and R4 as shown in FIG. 7. Needless to say that the above-described means can be arbitrarily selected as the variable resistors R1, R2, R3, and R4, respectively as described above. Meanwhile, it is also possible to set any of the variable resistors R1, R2, R3, and R4 as the fixed resistor.

Further, the output signal of the A/D conversion circuit AD1 is applied to the offset detection circuit Det2, and digital lowpass filter processing is performed in the offset detection circuit Det2, so that DC bias voltage+DC offset (Vbias1+ΔV) is detected. This offset detection signal is outputted by the D/A conversion circuit Da1 as the offset compensation signal (Vbias1+ΔV) which is an analog signal, and is inputted into the aforementioned differential amplifying circuit Amp1 through the aforementioned variable resistor R1 to thereby compensate the DC offset ΔV. When it is described in more detail, upon compensating the DC offset ΔV, the DC bias voltage Vbias1 is also canceled simultaneously. The output DC bias voltage of the variable gain amplifying circuit GCA1 is then set by the voltage Vbias2 instead of canceling the DC bias voltage Vbias1. This operation is the bias shift operation.

Further, if the DC offset ΔVgca is caused in the variable gain amplifying circuit GCA1, a signal for compensating ΔVgca is superposed on the aforementioned offset compensation signal Vbias1+ΔV, thereby making it possible to also compensate the DC offset ΔVgca of the variable gain amplifying circuit GCA1.

Here, another configuration example of the offset detection circuit Det2 will be now described with reference to FIG. 15 through FIG. 18.

Figure 15:
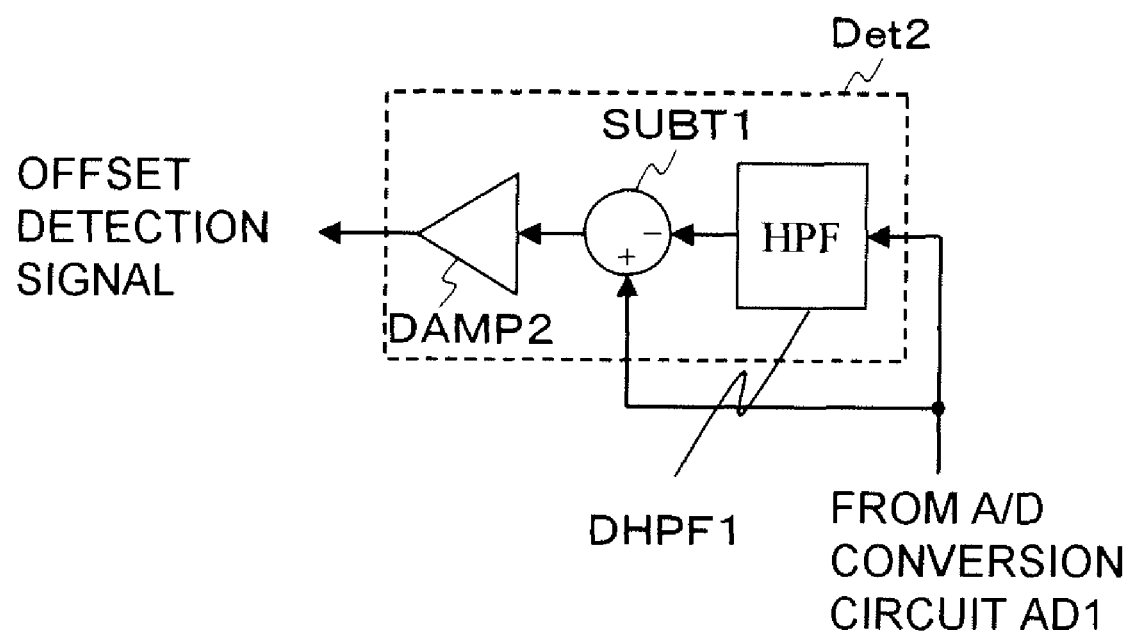
FIG. 15 is a block diagram showing a second configuration example of the offset detection circuit in the AGC circuit in accordance with the first embodiment of the present invention.

FIG. 15 shows a second configuration example of the offset detection circuit Det2. In FIG. 15, symbol DHPF1 represents a digital highpass filter, symbol SUBT1 represents a subtractor, and symbol DAMP2 represents a digital amplifier.

In this offset detection circuit Det2, the digital highpass filter DHPF1 uses the output signal of the A/D conversion circuit AD1 as an input, and extracts high-pass components thereof. The subtractor SUBT1 uses the output signal of the A/D conversion circuit AD1 and the output signal of the digital highpass filter DHPF1 as inputs, and subtracts the output signal of the digital highpass filter DHPF1 from the output signal of the A/D conversion circuit AD1.

Low-pass components (including the offset component) in the output signal of the A/D conversion circuit AD1 is outputted as an output signal of the subtractor SUBT1. Namely, the digital highpass filter DHPF1 and the subtractor SUBT1 will perform an operation equivalent to that of a digital lowpass filter. The output signal of the subtractor SUBT1 is amplified by the digital amplifier DAMP2, and results in the offset detection signal. Incidentally, the digital amplifier DAMP2 is provided for gain adjustment. The digital amplifier DAMP2 may be omitted unless the gain adjustment is necessary in the offset detection circuit Det2. Additionally, the digital amplifier DAMP2 may also be omitted if the D/A conversion circuit DA1 at a subsequent stage has a gain adjustment function.

Circuit scale of the highpass filter DHPF1 is smaller than that of a lowpass filter. The subtractor SUBT1 is required for the offset detection because of that reason, but in considering the whole offset detection circuit Det2, circuit scale when the highpass filter DHPF1 and the subtractor SUBT1 are used becomes smaller as compared with a case of using the lowpass filter, and it is advantageous for integration.

Figure 16:
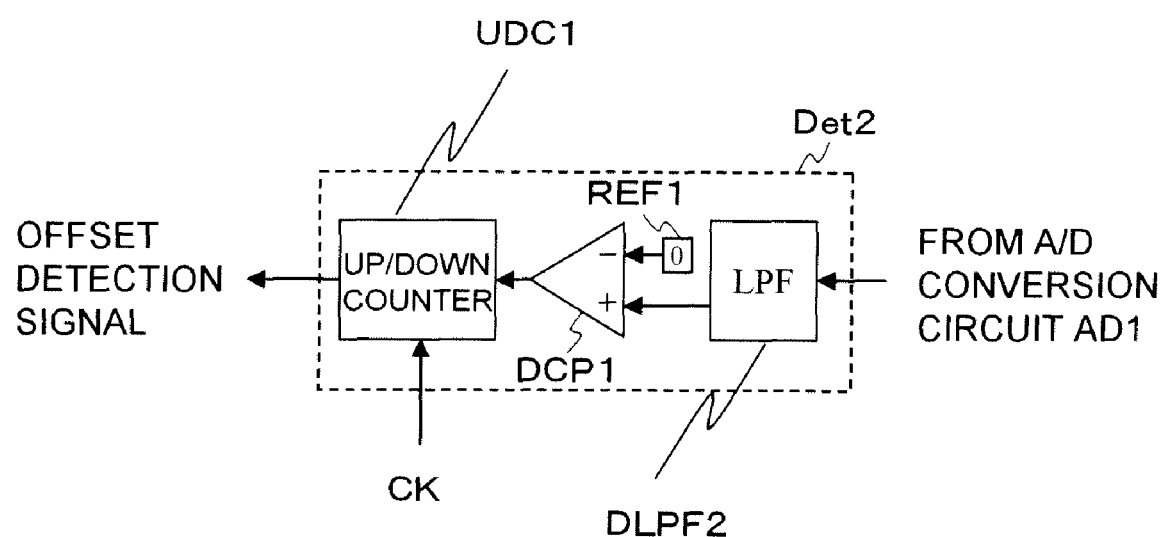
FIG. 16 is a block diagram showing a third configuration example of the offset detection circuit in the AGC circuit in accordance with the first embodiment of the present invention.

FIG. 16 shows a third configuration example of the offset detection circuit Det2. In FIG. 16, symbol DLPF2 represents a digital lowpass filter, symbol DCP1 represents a digital comparator, symbol UDC1 represents an up/down counter, and symbol REF1 represents predetermined reference data.

In this offset detection circuit Det2, the digital lowpass filter DLPF2 uses the output signal of the A/D conversion circuit AD1 as an input, and extracts low-pass components (including the offset component).

The digital comparator DCP1 compares and detects a magnitude relation between an output signal of the digital lowpass filter DLPF2 and the predetermined reference data REF1 (digital value), and outputs a comparison result signal. The up/down counter UDC1 counts input clocks, and operates to switch an up-count operation and a down-count operation based on the comparison result signal outputted from the digital comparator DCP1. Hence, a count value of the up/down counter UDC1 results in the offset detection signal, and corresponds to the DC component in the output signal of the A/D conversion circuit AD1.

As described above, the digital comparator DCP1 for comparing the output signal of the digital lowpass filter DLPF2 and the reference data REF1 is provided, and the up-count operation and down-count operation of the up/down counter UDC1 are switched depending on the comparison result signal of this digital comparator DCP1, thereby allowing an offset amount to be detected as the count value. Moreover, since the offset amount can be detected as the count value, following action effects will be obtained. If the up/down counter is not used, a digital amplifier having a gain according to a required offset compensation amount will be inserted, but if the up/down counter is used, the offset amount can be detected at a proper gain, without using the digital amplifier, so that it is advantageous for integration.

Figure 17:
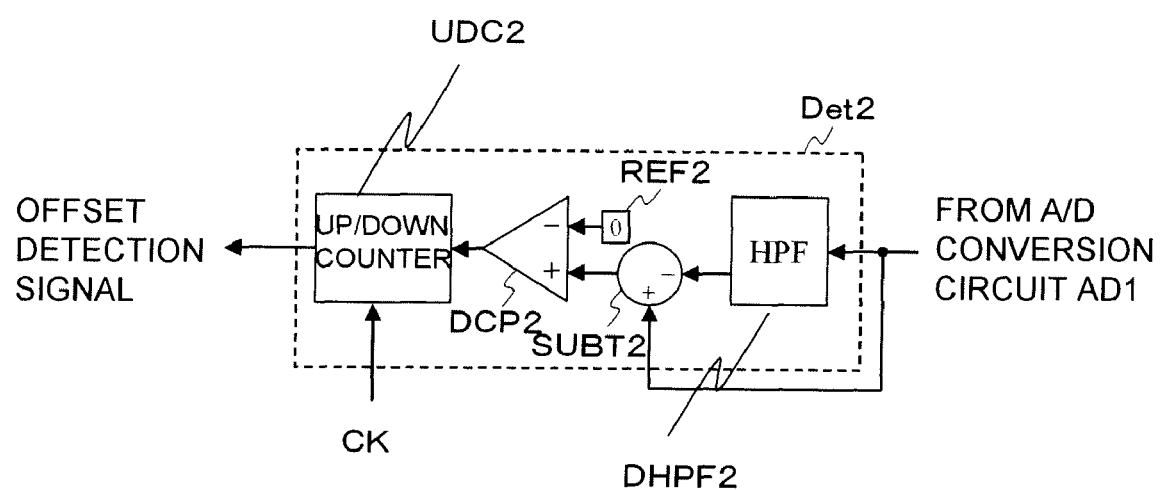
FIG. 17 is a block diagram showing a fourth configuration example of the offset detection circuit in the AGC circuit in accordance with the first embodiment of the present invention.

FIG. 17 shows a fourth configuration example of the offset detection circuit Det2. In FIG. 17, symbol DHPF2 represents a digital highpass filter, symbol SUBT2 represents a subtracter, symbol DCP2 represents a digital comparator, symbol UDC2 represents an up/down counter, and symbol REF2 represents predetermined reference data.

In this offset detection circuit Det2, the digital highpass filter DHPF2 uses the output signal the of A/D conversion circuit AD1 as an input, and extracts high-pass components thereof. The subtractor SUBT2 uses the output signal of the A/D conversion circuit AD1 and an output signal of the digital highpass filter DHPF2 as inputs, and subtracts the output signal of the digital highpass filter DHPF2 from the output signal of the A/D conversion circuit AD1. Low-pass components (including the offset component) in the output signal of the A/D conversion circuit AD1 is outputted as an output signal of the subtractor SUBT2. Namely, the digital highpass filter DHPF2 and the subtractor SUBT2 will perform an operation equivalent to that of a digital lowpass filter.

The digital comparator DCP2 compares and detects a magnitude relation between the output signal of the subtractor SUBT2 and the predetermined reference data REF2, and outputs a comparison result signal. The up/down counter UDC2 counts input clocks, and operates to switch an up-count operation and a down-count operation based on the comparison result signal outputted from the digital comparator DCP2. Hence, a count value of the up/down counter UDC2 results in the offset detection signal, and corresponds to the DC component in the output signal of the A/D conversion circuit AD1.

Action effects of both the offset detection circuit Det2 shown in FIG. 15 and the offset detection circuit Det2 shown in FIG. 16 are obtained if the offset detection circuit Det2 shown in FIG. 17 is used.

Figure 18:
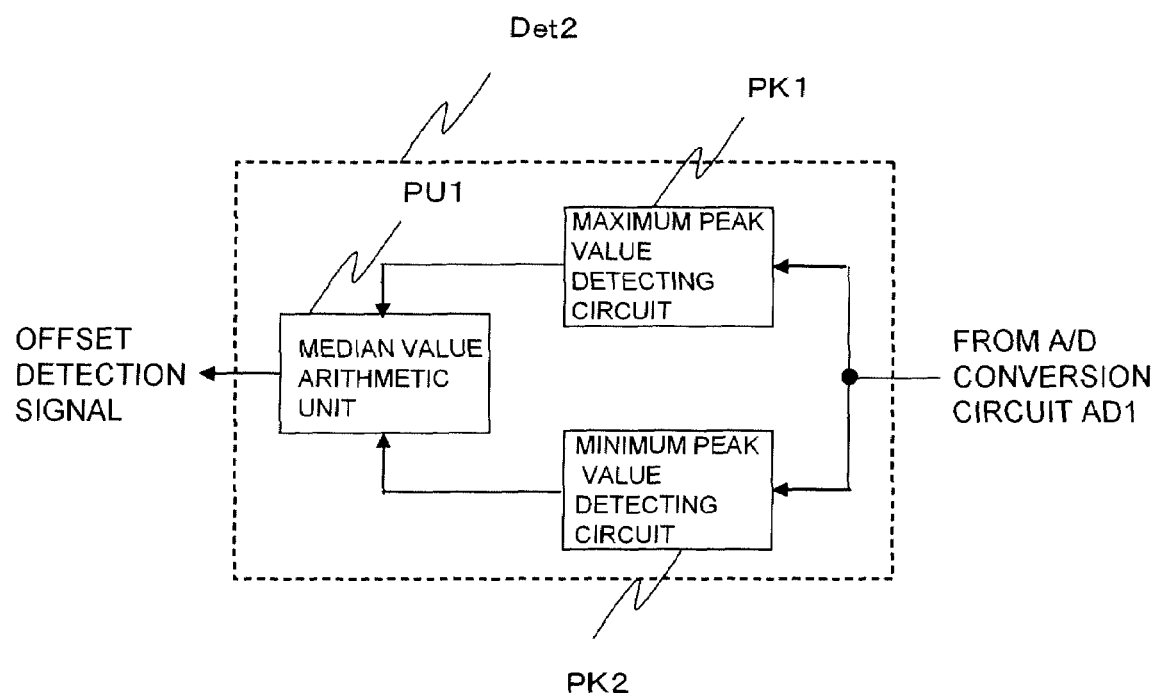
FIG. 18 is a block diagram showing a fifth configuration example of the offset detection circuit in the AGC circuit in accordance with the first embodiment of the present invention.

FIG. 18 shows a fifth example of the offset detection circuit Det2. This offset detection circuit Det2 is constituted by a maximum peak value detecting circuit PK1, a minimum peak value detecting circuit PK2, and a median value calculating unit PU1. Specifically, instead of performing lowpass filter processing, this offset detection circuit Det2 calculates a DC bias voltage including the offset component in such a way that a maximum peak value of the output signal Vout detected by the level detection circuit Det1 is detected by the maximum peak value detecting circuit PK1, a minimum peak value of the output signal Vout is detected by the minimum peak value detecting circuit PK2, and an intermediate value of the maximum peak value and the minimum peak value of the output signal Vout is calculated by the median value calculating unit PU1.

According to the configuration shown in FIG. 1, the configuration in which digital circuits are used in a circuit unit for controlling the gain and a circuit unit for compensating the offset, and the maximum inclination of the gain change on the time-axis is set based on the amplitude detection time Tdet and the maximum variable step Gstep of the gain control signal makes it possible to provide the AGC circuit that controls the gain of the variable gain amplifying circuit GCA1 according to the amplitude Vac of the input signal Vin, and also has an excellent DC offset of the output, without the needs of the integrating circuit using the capacitor at all. Accordingly, it is also easy to incorporate the AGC circuit in an integrated circuit.

Figure 8:
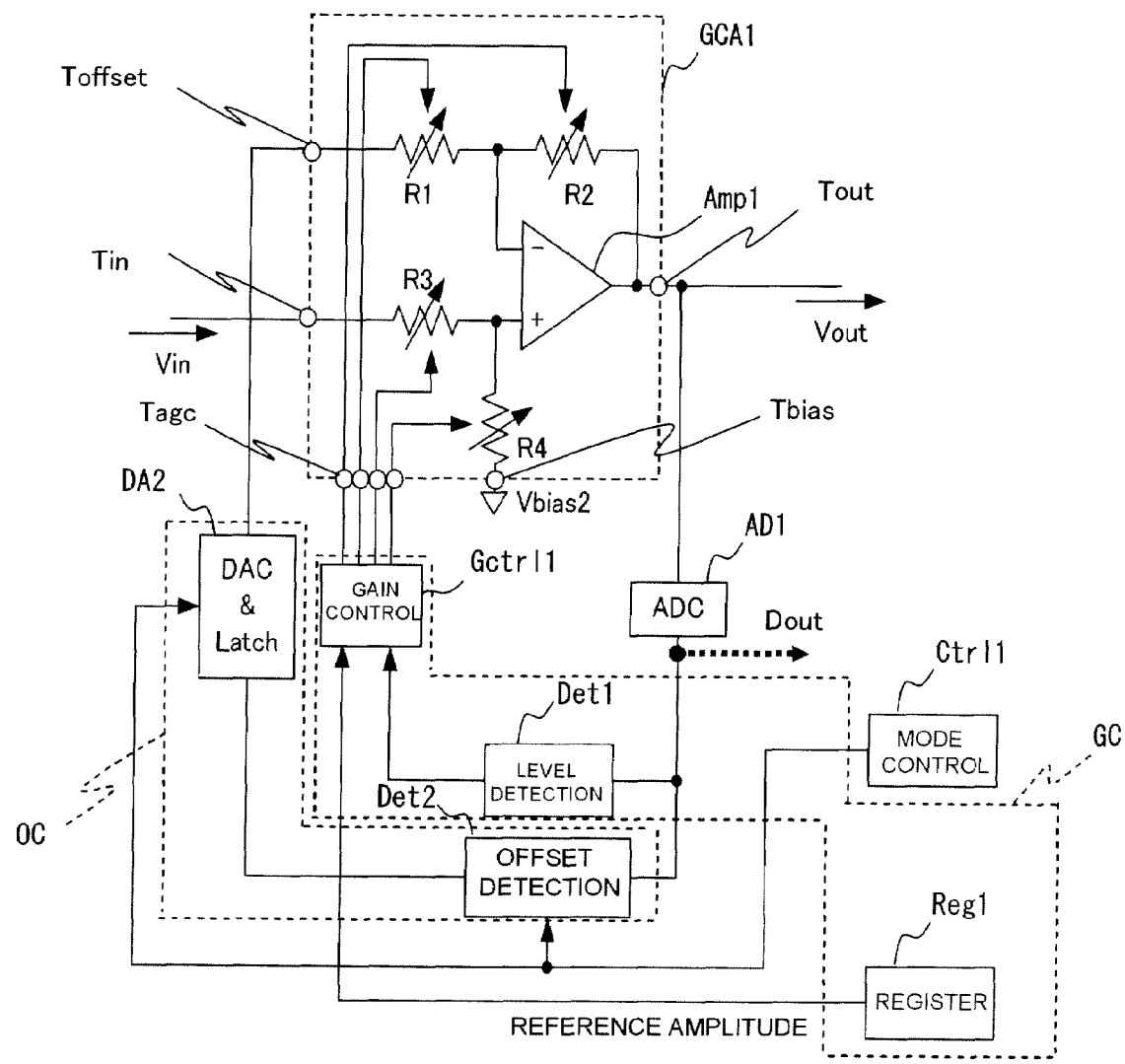
FIG. 8 is a block diagram showing another configuration of the AGC circuit in accordance with the first embodiment of the present invention.

Additionally, as shown in FIG. 8 there may be employed a configuration in which output signal holding means such as a latch circuit controlled by a mode control circuit Ctrl1 is provided in an output portion of a D/A conversion circuit DA2 for offset compensation signal output to thereby make it possible to switch an offset compensation operation mode (normal operation mode) and an offset compensation signal holding mode. When it becomes an offset compensation signal holding mode, the offset detection circuit Det2 which is not required to operate in this mode, and portions other than a circuit required for holding the offset compensation signal in the D/A conversion circuit PA2 are set to a resting state or a low consumption current state (low consumption current mode).

Constituting the AGC circuit in this way makes it possible to reduce the consumed current, without impairing the offset compensation capability of the AGC circuit in the embodiment of the present invention. Namely, the AGC circuit is set to an offset compensation operation mode only upon detecting that a state of a circuit connected to the input or the output of the AGC circuit is changed, such as upon detecting the power turn-on, upon detecting the AGC circuit being changed from a low power consumption state to an operating state by external control, in a case where, for example, a gain of an amplifier connected to a preceding stage of the AGC circuit is changed, or the like. After completing a series of offset compensation operations, it is then set to an offset compensation signal holding mode. In this offset compensation signal holding mode, the offset detection circuit and the D/A conversion circuit are set to a resting mode or a low consumption current mode. Constituting the AGC circuit in this way makes it possible to reduce the consumed current.

Figure 9:
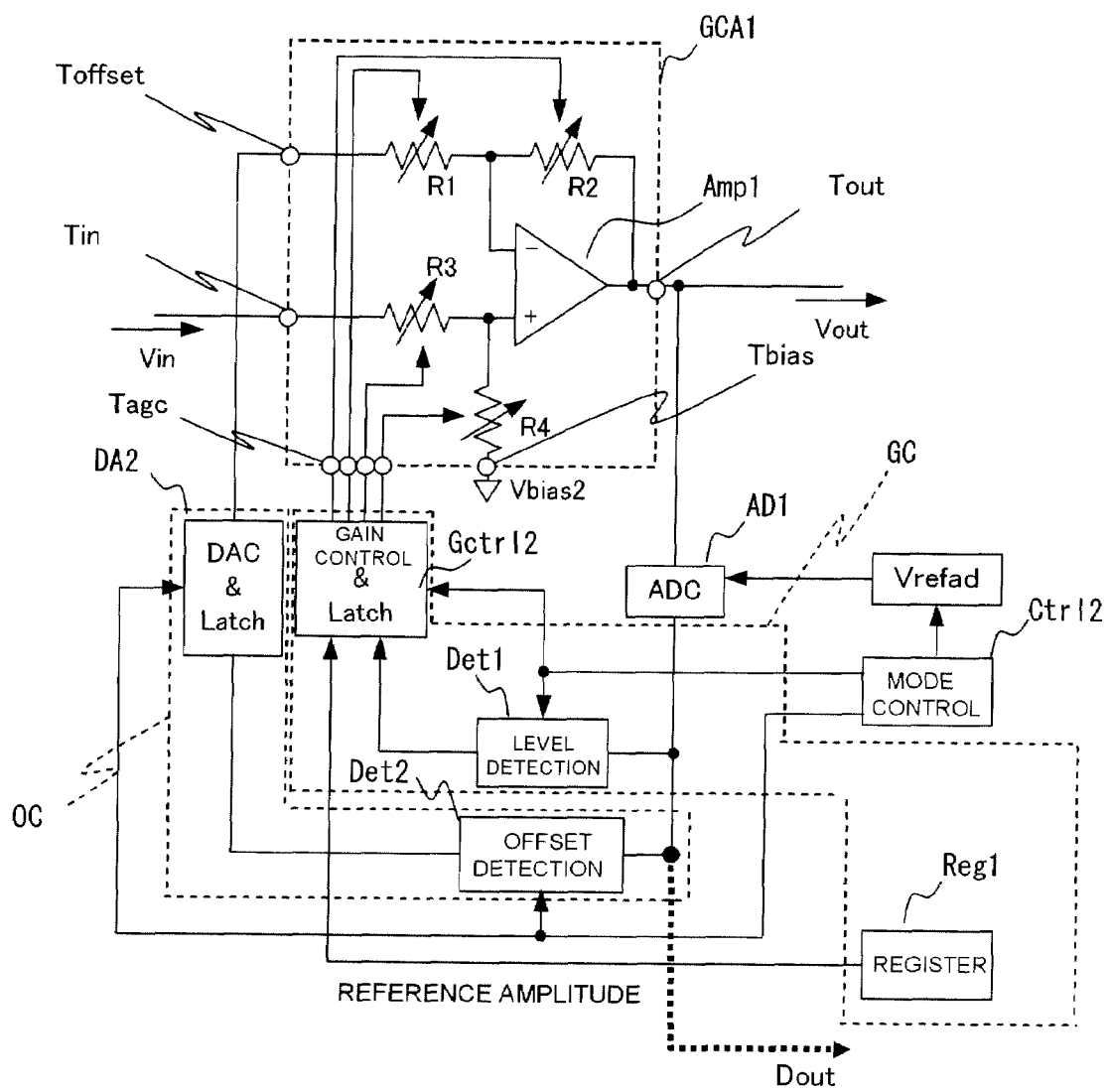
FIG. 9 is a block diagram showing still another configuration of the AGC circuit in accordance with the first embodiment of the present invention.

Further, as shown in FIG. 9, gain control signal holding means is provided to a gain control circuit Gctrl2 in addition to the aforementioned configuration shown in FIG. 8, and a mode control circuit Ctrl2 may control the gain control unit GC including the gain control circuit Gctrl2 and the level detection circuit Det1, and the offset compensation unit OC including the offset detection circuit Det2 and the D/A conversion circuit DA2 so as to exclusively operate. During a gain control operation, it controls the gain control unit GC to perform a gain control operation, and the offset compensation unit OC to be in an offset compensation signal holding mode. Meanwhile, during an offset compensation operation, the gain control unit GC is controlled to be in a gain control signal holding mode, and the offset compensation unit OC is controlled to perform the offset compensation operation.

Figure 10:
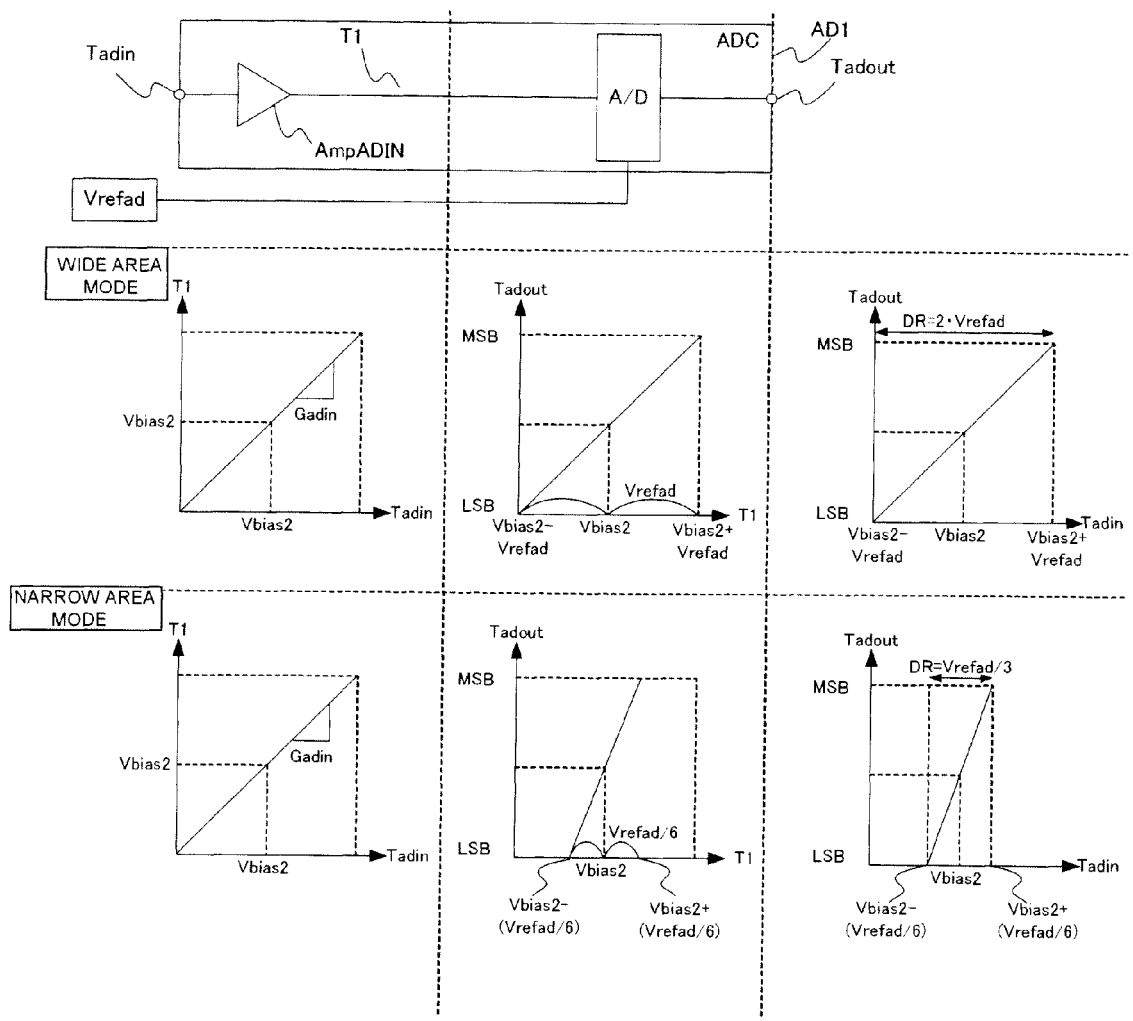
FIG. 10 is a view showing an example of means for changing an input dynamic range of an A/D conversion circuit included in the AGC circuit shown in FIG. 9.

Further, the ability to change a reference voltage Vrefad for determining an input dynamic range of the A/D conversion circuit is provided, and by selecting and controlling the reference voltage Vrefad by a mode control circuit Ctrl2, a wide area mode and a narrow area mode in an input dynamic range may be set in the A/D conversion circuit. In the case where the input dynamic range of the A/D conversion circuit has a proportionality relation with the reference voltage of the A/D conversion circuit as shown in, for example, FIG. 10, an input dynamic range DR is set to a wide area mode (=2·Vrefad) by increasing the reference voltage Vrefad to thereby make it possible for the input dynamic range DR of the A/D conversion circuit to cover the output amplitude of the AGC circuit during a gain control operation.

Meanwhile, during the offset compensation operation, the input dynamic range DR is set to a narrow area mode (=Vrefad/3) by decreasing the reference voltage (for example, Vrefad/6) to thereby make it possible to detect a very small offset voltage of the variable gain amplifying circuit.

Figure 11:
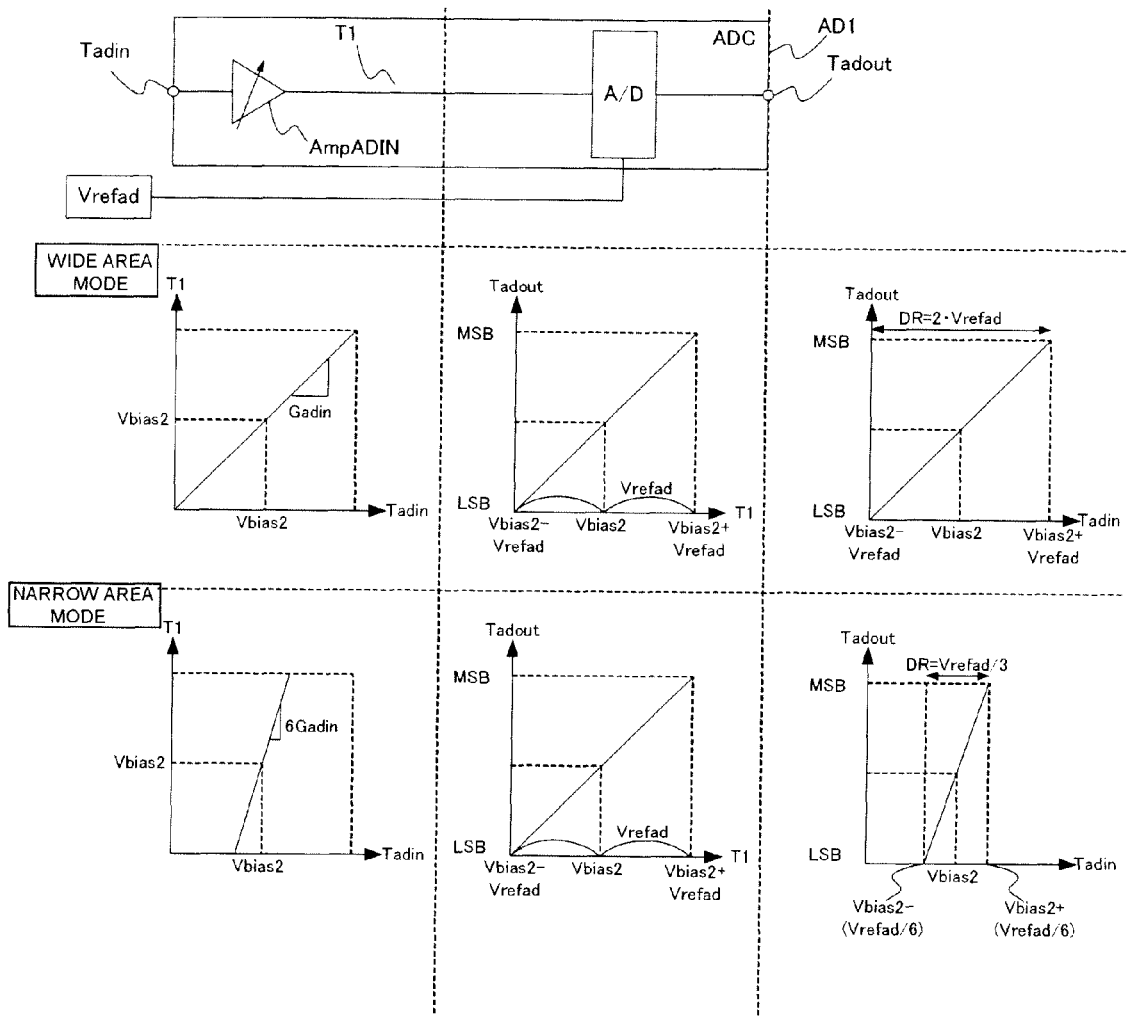
FIG. 11 is a view showing an example of another means for changing the input dynamic range of the A/D conversion circuit included in the AGC circuit shown in FIG. 9.

Moreover, a configuration shown in, for example, FIG. 11 may also be employed. Namely, an input amplifier AmpADIN in the A/D conversion circuit is used as a variable gain amplifier, and the input dynamic range DR is set to a wide area mode (=2·Vrefad) by decreasing a gain Gadin of the input amplifier AmpADIN in the A/D conversion circuit to thereby make it possible for the input dynamic range DR of the A/D conversion circuit to cover the output amplitude of the AGC circuit during a gain control operation. Meanwhile, during the offset compensation operation, the input dynamic range DR is set to a narrow area mode (=Vrefad/3) by decreasing the gain Gadin of the input amplifier AmpADIN in the A/D conversion circuit to thereby make it possible to detect a very small offset voltage of the variable gain amplifying circuit.

Constituting the AGC circuit in this way makes it possible to achieve a good balance between to take large output amplitude of the AGC circuit in the gain control operation and to increase offset compensation accuracy in the offset compensation operation, without changing the number of bits of the A/D conversion circuit.

Namely, the input dynamic range is increased by setting the A/D conversion circuit AD1 to a wide area mode during the gain control operation, thus allowing a wide output dynamic range to be secured for the AGC circuit. Meanwhile, the input dynamic range is reduced by setting the A/D conversion circuit AD1 to a narrow area mode during the offset compensation operation to thereby reduce a voltage value per LSB, thus allowing high detection accuracy to be secured.

For example, a case where a signal of 1 Vrms, namely, 2.8 Vpp, is treated as an AGC circuit output is considered. Let the number of bits of the A/D conversion circuit be 10 bits, and supposing that a relational expression represented by a following equation is satisfied among the reference voltage Vrefad of the A/D conversion circuit, the input dynamic range DR of the A/D conversion circuit, an input voltage Vinad that can be A/D converted in the A/D conversion circuit, and the output bias voltage Vbias2 of the AGC circuit.

$$DR = Vrefad * 2 \qquad \text{[Equation 6]}$$

$$Vbias2 - Vrefad \leq Vinad \leq Vbias2 + Vrefad \qquad \text{[Equation 7]}$$

Further, let a reference voltage Vrefad1 in a wide area mode of the A/D conversion circuit be 1.5 volts, and a reference voltage Vrefad2 in a narrow area mode be 0.25 volts.

At this time, an input dynamic range DR1 of the A/D conversion circuit is 3.0 volts, and is about 3 millivolts per LSB, in a wide area mode. Meanwhile, in a narrow area mode, an input dynamic range DR2 of the A/D conversion circuit is 0.5 volts, and is 0.5 millivolts per LSB. Considering that the DC offset voltage of the amplifying circuit is typically several millivolts to several tens of millivolts, preparing a narrow area mode for the A/D conversion circuit as described above allows a very high offset compensation operation.

It is to be noted that there is no holding means in the D/A conversion circuit, but it is needless to say that a configuration in which the holding means is given to the gain control circuit may also be considered.

Second Embodiment

Figure 12:
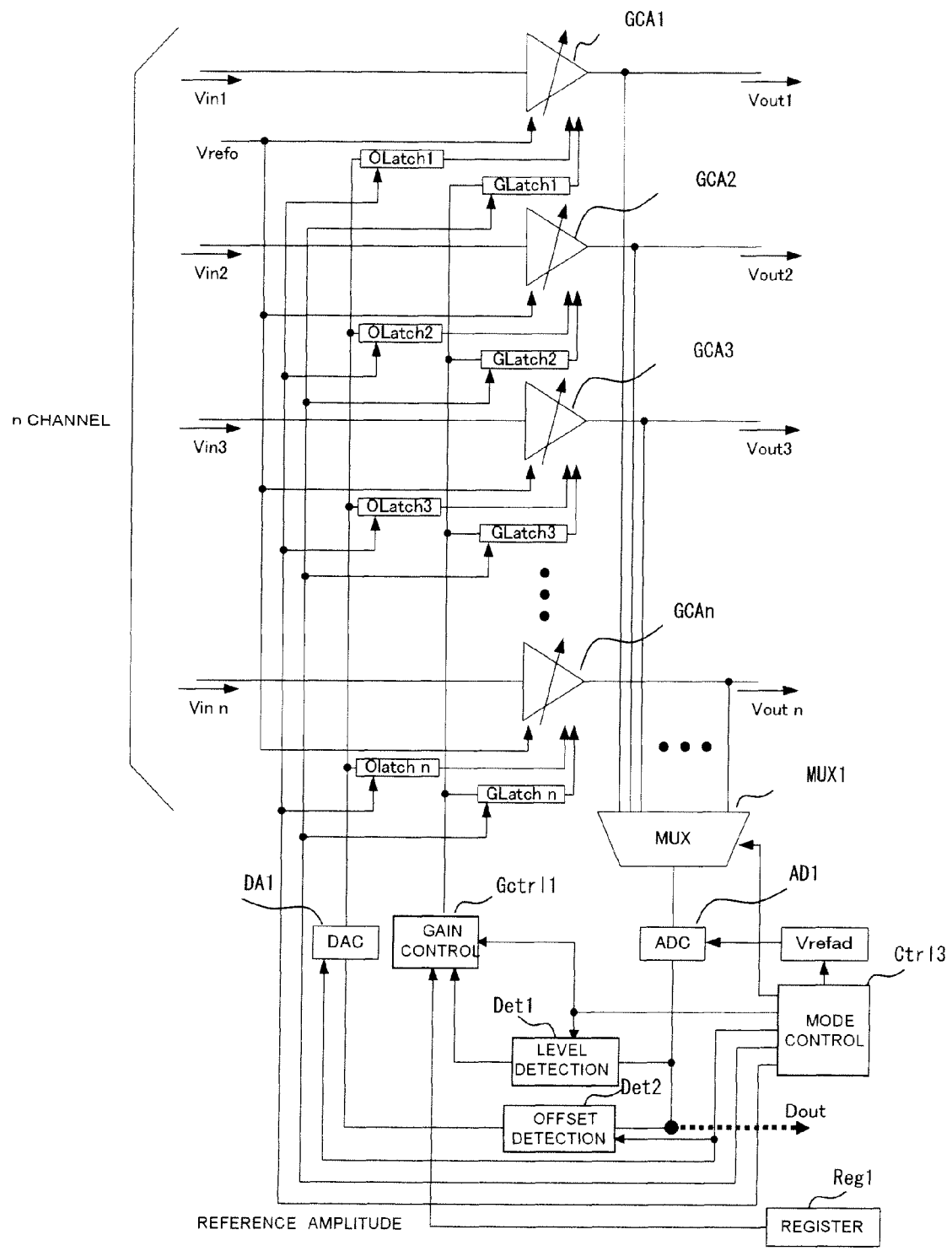
FIG. 12 is a block diagram showing a configuration of an AGC circuit in accordance with a second embodiment of the present invention.

FIG. 12 shows a configuration of an AGC circuit in accordance with a second embodiment of the present invention.

In FIG. 12, description will be omitted by giving the same symbol to the same component as that of the AGC circuit shown in FIG. 9, and only components which are newly added to the AGC circuit shown in FIG. 1 will be described.

In FIG. 12, n (n≧2) variable gain amplifying circuits GCA1, GCA2, ..., GCAn, n gain control signal holding circuits GLatch1, GLatch2, ..., GLatchn, n offset compensation signal holding circuits OLatch1, OLatch2, ..., OLatchn, a selector circuit MUX1 that receives output signals Vout1, Vout2, ..., Voutn of the variable gain amplifying circuits GCA1, GCA2, ..., GCAn, and selects one of them to then output it to an A/D converter AD1, and a mode control circuit Ctrl3 that controls a signal selection, a gain control operation, and the offset compensation operation are arranged in this AGC circuit.

Signals Vin1, Vin2, ..., Vinn are inputted into the n channel variable gain amplifying circuits GCA1, GCA2, ..., GCAn. In addition, a reference voltage Vref0 is applied to the variable gain amplifying circuits GCA1, GCA2, ..., GCAn in common to thereby set an output DC bias.

Meanwhile, a gain control signal holding circuit GLatchk (k=1, 2, ..., n) and an offset compensation signal holding circuit OLatchk are controlled in a signal conduction state or a signal holding state by the mode control circuit Ctrl3.

Additionally, the gain control signal outputted from the aforementioned gain control circuit Gctrl1 is connected to the aforementioned variable gain amplifying circuit GCAk through the aforementioned gain control signal holding circuit GLatchk, and the offset compensation signal outputted from the D/A conversion circuit DA1 is connected thereto through the aforementioned offset compensation signal holding circuit OLatchk.

Further, a control signal for signal holding is to be outputted from a mode control circuit Ctrl3 to the aforementioned gain control signal holding circuit GLatchk and the aforementioned offset compensation signal holding circuit OLatchk.

Moreover, the mode control circuit Ctrl3 is configured to output a control signal for signal selection to the selector circuit MUX1.

Concrete operations will be described hereinafter. In this AGC circuit, the signals Vink (k=1, 2, ..., n) are inputted into the aforementioned n variable gain amplifying circuits GCAk (k=1, 2, ..., n), respectively, and the output signals Voutk (k=1, 2, ..., n) respectively amplified by the variable gain amplifying circuits GCAk by gains Gk are outputted. These output signals Voutk are inputted into the aforementioned selector circuit MUX1, and are selected by the control signal for signal selection outputted from the control circuit Ctrl3 and the selected signal is inputted into the A/D conversion circuit AD1.

During a gain control operation, the signal inputted into the A/D conversion circuit AD1 is converted into the gain control signal by the level detection circuit Det1 and the gain control circuit Gctrl1, and changes the gain of the variable gain amplifying circuit GCAk through the gain control signal holding circuit GLatchk that is set to a signal conduction state by the control circuit Ctrl3. At this time, gain control signal holding circuits GLatchi (i=1, 2, ..., n, i≠k) other than the gain control signal holding circuit GLatchk and all the offset compensation signal holding circuits OLatch1, OLatch2, ..., OLatchn are controlled in a signal holding state by the mode control circuit Ctrl3. The aforementioned gain control operation is performed in order from k=1 to k=n, the gain control operations for all the variable gain amplifying circuits GCA1, GCA2, ..., GCAn are implemented by one cycle, and the gain control operation is continued while repeating this one cycle operation.

Meanwhile, during the offset compensation operation, an output signal Voutk of the variable gain amplifying circuit GCAk that is selected by the selector circuit MUX1 and is A/D converted by the A/D conversion circuit AD1 is converted into the offset compensation signal by the offset detection circuit Det1 and the D/A conversion circuit DA1. The offset compensation of the variable gain amplifying circuit GCAk is then performed through the offset compensation signal holding circuit OLatchk that is set to a signal conduction state by the mode control circuit Ctrl3. At this time, all the gain control signal holding circuits GLatch1, GLatch2, ..., GLatchn and gain control signal holding circuits OLatchi other than the gain control signal holding circuit OLatchk (i=1, 2, ..., n, 1≠k) are controlled in a signal holding state by the mode control circuit Ctrl3.

Figure 13:
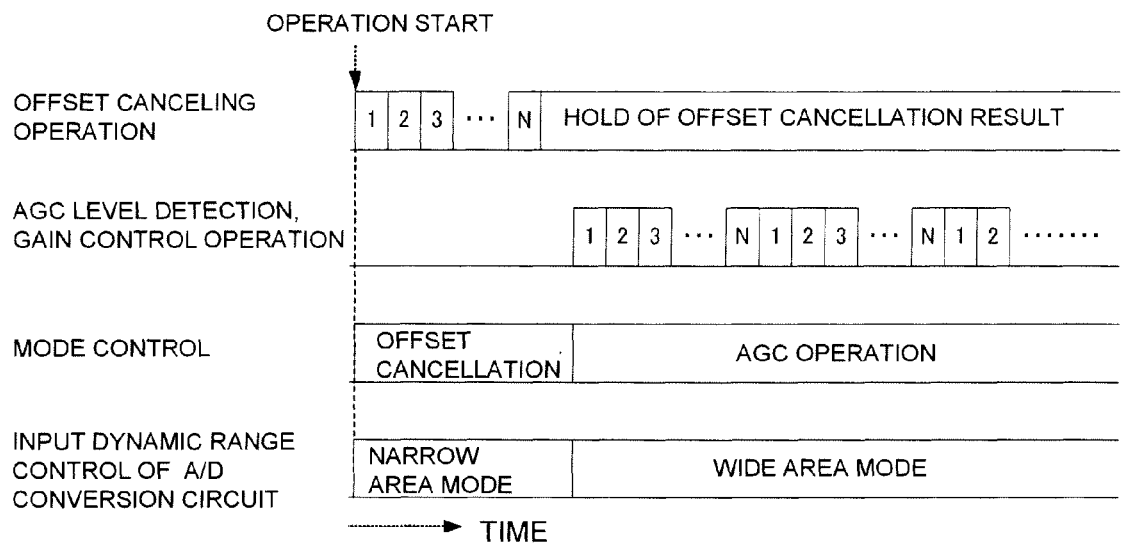
FIG. 13 is a timing chart showing a temporal operation of the AGC circuit shown in FIG. 12.

The aforementioned offset compensation operation is performed in order from k=1 to k=n, the offset compensation operations for all the variable gain amplifying circuits GCA1, GCA2, ..., GCAn are implemented by one cycle, and the offset compensation operation is completed. The aforementioned offset compensation operation may be implemented by two cycles or more. Moreover, if the variable gain amplifying circuit GCAk is kept at a non-signal state during the offset compensation operation, it is possible to implement the offset compensation operation highly accurately. One example of a time-series flow of the aforementioned offset compensation operation and the gain control operation is shown in FIG. 13.

According to the configuration shown in FIG. 12, only the number of variable gain amplifying circuits increases, but an increase in the A/D conversion circuit and the D/A conversion circuit which require large circuit scale and chip area is not required even in a system which requires a plurality of AGC circuits, and thus it is possible to provide the superior AGC circuit that can be easily incorporated into an integrated circuit. A signal frequency particularly in audio systems is a relative low frequency at 20 kHz or less, so that when improvement in speed of the A/D conversion circuit and the D/A conversion circuit in recent years is taken into consideration, it is possible to provide a multi-channel AGC circuit with the minimum circuit scale and chip area.

INDUSTRIAL AVAILABILITY

As described above, the AGC circuit of the present invention is an AGC circuit that does not use at all the integrating circuit which requires a capacitor, has a very small DC offset, is suitable for integration in multi-channel, and is superior in applicability particularly to the audio systems.

The invention claimed is:

1. An AGC circuit, comprising
a variable gain amplifying circuit for amplifying an inputted signal;
an A/D conversion circuit for A/D converting an output signal of the variable gain amplifying circuit;
a gain control unit for detecting an output amplitude of the variable gain amplifying circuit from an output signal of the A/D conversion circuit, comparing the output amplitude of the variable gain amplifying circuit with preset reference amplitude to thereby generate gain control signals, and outputting the generated gain control signals to the variable gain amplifying circuit; and
an offset compensation unit for detecting an output DC offset amount of the variable gain amplifying circuit from the output signal of the A/D conversion circuit, generating an offset compensation signal for compensating an output DC offset of the variable gain amplifying circuit, and outputting the generated offset compensation signal to the variable gain amplifying circuit.

2. The AGC circuit according to claim 1, wherein the variable gain amplifying circuit is comprised of a signal input terminal, a signal output terminal, gain control terminals into which the gain control signals are inputted, an offset compensation terminal into which the offset compensation signal is inputted, a reference voltage terminal into which a reference voltage is inputted, a differential amplifying circuit whose output terminal becomes the signal output terminal, a first variable resistor connected between the offset compensation terminal and an inverting input terminal of the differential amplifying circuit, a second variable resistor connected between the inverting input terminal of the differential amplifying circuit and the output terminal thereof, a third variable resistor connected between the signal input terminal and a non-inverting input terminal of the differential amplifying circuit, and a fourth variable resistor connected between the non-inverting input terminal of the differential amplifying circuit and the reference voltage terminal, and the first to fourth variable resistors change resistance values according to the gain control signals inputted from the gain control terminals.

3. The AGC circuit according to claim 1, wherein the reference amplitude is set by a register.

4. The AGC circuit according to claim 1, wherein the gain control unit is comprised of a level detection circuit for detecting the output amplitude of the variable gain amplifying circuit from the output signal of the A/D conversion circuit, and a gain control circuit for comparing the output amplitude of the variable gain amplifying circuit detected by the level detection circuit with the preset reference amplitude to thereby generate the gain control signals, and outputting the generated gain control signals to the variable gain amplifying circuit.

5. The AGC circuit according to claim 1, wherein the offset compensation unit is comprised of an offset detection circuit for detecting the output DC offset amount of the variable gain amplifying circuit from the output signal of the A/D conversion circuit, and an offset compensation circuit for generating the offset compensation signal that compensates the output DC offset of the variable gain amplifying circuit detected by the offset detection circuit, and outputting the generated offset compensation signal to the variable gain amplifying circuit.

6. The AGC circuit according to claim 5, wherein the offset compensation circuit is comprised of a D/A conversion circuit.

7. The AGC circuit according to claim 5, wherein the offset detection circuit is comprised of a lowpass filter for extracting low-pass components in the output signal of the A/D conversion circuit.

8. The AGC circuit according to claim 5, wherein the offset detection circuit is comprised of a highpass filter for extracting high-pass components in the output signal of the A/D conversion circuit, and a subtractor for subtracting an output signal of the highpass filter from the output signal of the A/D conversion circuit.

9. The AGC circuit according to claim 5, wherein the offset detection circuit is comprised of a lowpass filter for extracting low-pass components in the output signal of the A/D conversion circuit, a comparator for comparing an output signal of the lowpass filter with predetermined reference data, and an up/down counter for up-counting or down-counting input clocks using a comparison result signal of the comparator as an up/down switching signal.

10. The AGC circuit according to claim 5, wherein the offset detection circuit is comprised of a highpass filter for extracting high-pass components in the output signal of the A/D conversion circuit, a subtracter for subtracting an output signal of the highpass filter from the output signal of the A/D conversion circuit, a comparator for comparing an output signal of the subtractor with predetermined reference data, and an up/down counter for up-counting or down-counting input clocks using a comparison result signal of the comparator as an up/down switching signal.

11. The AGC circuit according to claim 5, wherein the offset detection circuit is comprised of an upper peak value detector for detecting an upper peak value of the output signal of the A/D conversion circuit, a lower peak value detection circuit for detecting a lower peak value of the output signal of the A/D conversion circuit, and a median value calculating unit for calculating a median value between the upper peak value and the lower peak value.

12. The AGC circuit according to claim 1, wherein the variable gain amplifying circuit includes a resistance circuit for determining a gain, and the resistance circuit is comprised of a plurality of resistors that have different resistance values, respectively, and are selected according to the gain control signals.

13. The AGC circuit according to claim 1, wherein the variable gain amplifying circuit includes a resistance circuit for determining a gain, and the resistance circuit is comprised of a MOSFET whose drain resistance changes according to the gain control signal inputted into a gate thereof.

14. The AGC circuit according to claim 1, wherein the variable gain amplifying circuit includes a resistance circuit for determining a gain, and the resistance circuit is comprised of a diode whose forward resistance changes according to the gain control signal that flows in the form of a current.

15. The AGC circuit according to claim 1, wherein the variable gain amplifying circuit includes a resistance circuit for determining a gain, and the resistance circuit is comprised of a combination of at least any two of a plurality of resistors that have different resistance values, respectively, and are selected according to the gain control signals, a MOSFET whose drain resistance changes according to the gain control signal inputted into a gate thereof, and a diode whose forward resistance changes according to the gain control signal that flows in the form of a current.

16. The AGC circuit according to claim 1, wherein the variable gain amplifying circuit is provided with a bias shift function that differentiates an input DC bias voltage and an output DC bias voltage.

17. The AGC circuit according to claim 1, wherein either or both of the gain control unit and the offset compensation unit have output value holding means for holding an output value.

18. The AGC circuit according to claim 1, wherein either or both of the gain control unit and the offset compensation unit are provided with output value holding means for holding an output value, and the AGC circuit is provided with a mode control circuit for operating either or both of the gain control unit and the offset compensation unit in a low consumption current mode of stopping operations of circuit units which are not used by the output holding means, during a state of holding the output value by the output holding means.

19. The AGC circuit according to claim 1, wherein both the gain control unit and the offset compensation unit are provided with output value holding means for holding an output value, and the AGC circuit is provided with a mode control circuit for making the gain control unit and the offset compensation unit perform an exclusive operation such that the offset compensation unit performs an offset compensation operation during a period when the gain control unit holds the output value by the output holding means, and the gain control unit performs a gain control operation during a period when the offset compensation unit holds the output value by the output holding means.

20. The AGC circuit according to claim 19, wherein a difference between a voltage value corresponding to one LSB of the A/D conversion circuit during a period when the gain control unit is performing the gain control operation, and a voltage value corresponding to one LSB of the A/D conversion circuit during a period when the offset compensation unit is performing the offset compensation operation causes a difference between an input dynamic range of the A/D conversion circuit during a period when the gain control unit is performing the gain control operation, and an input dynamic range of the A/D conversion circuit during a period when the offset compensation unit is performing the offset compensation operation.

21. The AGC circuit according to claim 19, wherein a difference between gain of the input stage amplifier of the A/D conversion circuit during a period when the gain control unit is performing the gain control operation, and gain of the input stage amplifier of the A/D conversion circuit during a period when the offset compensation unit is performing the offset compensation operation causes a difference between an input dynamic range of the A/D conversion circuit during a period when the gain control unit is performing the gain control operation, and an input dynamic range of the A/D conversion circuit during a period when the offset compensation unit is performing the offset compensation operation.

22. The AGC circuit according to claim 19, wherein, in terms of a reference voltage for determining an input dynamic range of the A/D conversion circuit, a difference between the reference voltage during a period when the gain control unit is performing the gain control operation, and the reference voltage during a period when the offset compensation unit is performing the offset compensation operation causes a difference between an input dynamic range of the A/D conversion circuit during a period when the gain control unit is performing the gain control operation, and an input dynamic range of the A/D conversion circuit during a period when the offset compensation unit is performing the offset compensation operation.

23. The AGC circuit according to claim 1, comprising a plurality of variable gain amplifying circuits, wherein the gain control unit gain-controls the plurality of variable gain amplifying circuits, and the offset compensation unit offset-compensates the plurality of variable gain amplifying circuits.

24. The AGC circuit according to claim 23, wherein the gain control unit gain-controls the plurality of variable gain amplifying circuits in time sharing, and the offset compensation unit offset-compensates the plurality of variable gain amplifying circuits in time sharing.

* * * * *